United States Patent
Okamoto

(10) Patent No.: US 12,128,500 B2
(45) Date of Patent: Oct. 29, 2024

(54) MANUFACTURING METHOD FOR VAPOR DEPOSITION MASK DEVICE AND MANUFACTURING APPARATUS FOR VAPOR DEPOSITION MASK DEVICE

(71) Applicant: Dai Nippon Printing Co., Ltd., Tokyo (JP)

(72) Inventor: Hideyuki Okamoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 1216 days.

(21) Appl. No.: 16/644,299

(22) PCT Filed: Aug. 8, 2018

(86) PCT No.: PCT/JP2018/029845
§ 371 (c)(1),
(2) Date: Mar. 4, 2020

(87) PCT Pub. No.: WO2019/049600
PCT Pub. Date: Mar. 14, 2019

(65) Prior Publication Data
US 2021/0060700 A1    Mar. 4, 2021

(30) Foreign Application Priority Data
Sep. 5, 2017 (JP) ................ 2017-170469

(51) Int. Cl.
*B23K 26/21* (2014.01)
*B23K 37/04* (2006.01)
(Continued)

(52) U.S. Cl.
CPC .......... *B23K 26/21* (2015.10); *B23K 37/0443* (2013.01); *C23C 14/042* (2013.01); *B23K 26/083* (2013.01)

(58) Field of Classification Search
None
See application file for complete search history.

(56) References Cited

U.S. PATENT DOCUMENTS

2011/0146573 A1* 6/2011 Park ................ C23C 14/042
    118/712
2013/0318774 A1* 12/2013 Kang .............. C23C 14/042
    254/133 R
(Continued)

FOREIGN PATENT DOCUMENTS

CN    105745352 A    7/2016
CN    106884138 A    6/2017
(Continued)

OTHER PUBLICATIONS

Machine translation of JP-2005-339,858-A, Sep. 2023.*
(Continued)

*Primary Examiner* — Geoffrey S Evans
(74) *Attorney, Agent, or Firm* — BURR PATENT LAW, PLLC

(57) ABSTRACT

A method of manufacturing a vapor deposition mask device includes: a preparing step of preparing a vapor deposition mask that includes a plurality of through-holes extending from a first surface to a second surface; and a welding step of welding the vapor deposition mask to a front surface of a frame that includes the front surface and a back surface opposite to the front surface.

31 Claims, 28 Drawing Sheets

(51) Int. Cl.
*C23C 14/04* (2006.01)
*B23K 26/08* (2014.01)

(56) References Cited

U.S. PATENT DOCUMENTS

| | | | | |
|---|---|---|---|---|
| 2016/0260935 | A1* | 9/2016 | Lee | C23C 14/042 |
| 2016/0301006 | A1 | 10/2016 | Obata et al. | |
| 2017/0133593 | A1* | 5/2017 | Jo | C23C 14/042 |
| 2018/0291494 | A1* | 10/2018 | Cao | C23C 14/042 |
| 2019/0319190 | A1* | 10/2019 | Nakamura | H10K 71/164 |

FOREIGN PATENT DOCUMENTS

| | | | |
|---|---|---|---|
| JP | 2001-234385 A1 | 8/2001 | |
| JP | 2005-339858 A1 | 12/2005 | |
| JP | 2005-339861 A1 | 12/2005 | |
| JP | 2005339858 A * | 12/2005 | |
| JP | 2006-114402 A1 | 4/2006 | |
| JP | 5382259 B1 | 1/2014 | |
| JP | 2016-094667 A1 | 5/2016 | |
| KR | 10-2007-0064906 A | 6/2007 | |
| WO | WO-2006062035 A1 * | 6/2006 | C23C 14/042 |
| WO | 2007/073072 A1 | 6/2007 | |

OTHER PUBLICATIONS

Machine translation of WO-2006062035-A, Sep. 2023.*
Korean Office Action (Application No. 10-2020-7009702) dated Dec. 14, 2021 (with English translation).
Chinese Office Action (Application No. 201811019098.x) dated Jun. 30, 2020 (with English translation).
Chinese Office Action (Application No. 201811019098.x) dated Mar. 23, 2021 (with English translation).
Extended European Search Report (Application No. 18853659.3) dated May 25, 2021.
International Search Report and Written Opinion (Application No. PCT/JP2018/029845) dated Oct. 2, 2018.
Taiwanese Office Action (Application No. 107128260) dated Apr. 18, 2019 (with English translation).

* cited by examiner

MANUFACTURING METHOD FOR VAPOR DEPOSITION MASK DEVICE AND MANUFACTURING APPARATUS FOR VAPOR DEPOSITION MASK DEVICE

TECHNICAL FIELD

An embodiment of the present disclosure relates to a manufacturing method for a vapor deposition mask device and a manufacturing apparatus for a vapor deposition mask device, the vapor deposition mask device including a vapor deposition mask formed with a plurality of through-holes, and a frame supporting the vapor deposition mask.

BACKGROUND ART

In recent years, display devices are usable in portable devices such as smartphones and tablet personal computers (PCs) have been required to have a high resolution, for example, a pixel density of equal to or more than 500 ppi. In addition, in the portable devices, also, there has been a demand for coping with ultra full high-definition; in this case, the pixel density of a display device is required, for example, to be equal to or more than 800 ppi.

Among the display devices, the organic electronic luminescent (EL) display device is paid attention to, due to its good response property, low power consumption and high contrast. As a method for forming pixels of the organic EL display device, there is known a method in which pixels are formed in a desired pattern by use of a vapor deposition mask formed with through-holes arranged in a desired pattern. Specifically, first, the vapor deposition mask is put in close contact with a substrate of the organic EL display device. Next, the vapor deposition mask and the substrate in close contact with each other are placed in a vapor deposition device, and a vapor deposition step of vapor-depositing an organic material on the substrate is performed. In this case, for precisely producing the organic EL display device having a high pixel density, it is required to precisely reproduce positions and shapes of the through-holes of the vapor deposition mask according to a design.

The vapor deposition device for performing the vapor deposition step of vapor depositing a vapor deposition material such as an organic material on the substrate includes a vapor deposition mask device which includes a vapor deposition mask and a frame supporting the vapor deposition mask. The frame supports the vapor deposition mask in a pulled state such that flexure of the vapor deposition mask will not occur. The vapor deposition mask is fixed to the frame by welding.

PRIOR ART DOCUMENT

Patent Documents

Patent Document 1: Japanese Patent No. 5382259
Patent Document 2: Japanese Patent Laid-open No. 2001-234385

In order to accurately vapor deposit the vapor deposition material on the substrate in a desired pattern, it is preferable that the thickness of the vapor deposition mask is small. Incidentally, in a case where the thickness of the vapor deposition mask is reduced, flexure or a wavy shape may be generated in the vapor deposition mask when the vapor deposition mask is supported on the frame in a pulled state. Therefore, adhesion between the vapor deposition mask and the frame may be lowered, and defective welding may occur in areas where the vapor deposition mask and the frame are not in close adhesion with each other, possibly resulting in that a strength at the weld section of the vapor deposition mask cannot be sufficiently secured. Especially, where the thickness of the vapor deposition mask is small, the strength at the weld section can become a problem.

It is an object of the present disclosure to provide a manufacturing method for a vapor deposition mask device and a manufacturing apparatus for a vapor deposition mask device by which the aforementioned problem can be effectively solved.

DISCLOSURE OF INVENTION

According to an embodiment of the present disclosure, there is provided a method of manufacturing a vapor deposition mask device, including: a preparing step of preparing a vapor deposition mask that includes a plurality of through-holes extending from a first surface to a second surface; and a welding step of welding the vapor deposition mask to a front surface of a frame that includes the front surface and a back surface opposite to the front surface, in which the vapor deposition mask has a pair of ear parts constituting a pair of end portions, each of the pair of ear parts includes a weld section welded to the front surface of the frame, and an extension section located between the weld section and the end portion of the vapor deposition mask, and the welding step includes: a step of applying tension to the vapor deposition mask in such a manner that the second surface of the weld section is in close contact with the front surface of the frame, and the second surface of the extension section is at least partly located toward the back surface of the frame rather than the front surface of the frame; and a step of joining the weld section of the vapor deposition mask to the frame in a state in which the tension is applied to the vapor deposition mask.

In the method of manufacturing the vapor deposition mask device according to the embodiment of the present disclosure, in the step of joining the weld section to the frame, laser light may be applied from the first surface.

In the method of manufacturing the vapor deposition mask device according to the embodiment of the present disclosure, in the step of applying the tension to the vapor deposition mask, the frame may be moved in a normal direction of the first surface.

In the method of manufacturing the vapor deposition mask device according to the embodiment of the present disclosure, in the step of applying the tension to the vapor deposition mask, the vapor deposition mask may be supported by a jig.

In the method of manufacturing the vapor deposition mask device according to the embodiment of the present disclosure, the jig may be a clamp.

In the method of manufacturing the vapor deposition mask device according to the embodiment of the present disclosure, in the step of applying the tension to the vapor deposition mask, the extension section of the vapor deposition mask may be clamped by the clamp.

In the method of manufacturing the vapor deposition mask device according to the embodiment of the present disclosure, the clamp includes a first clamp that clamps the extension section of one of the pair of ear parts, and a second clamp that clamps the extension section of the other of the pair of ear parts.

In the method of manufacturing the vapor deposition mask device according to the embodiment of the present disclosure, in the step of applying the tension to the vapor deposition mask, at least one of the first clamp and the second clamp may be moved in a normal direction of the first surface.

In the method of manufacturing the vapor deposition mask device according to the embodiment of the present disclosure, in the step of applying the tension to the vapor deposition mask, at least one of the first clamp and the second clamp may be moved along a plane direction of the first surface.

In the method of manufacturing the vapor deposition mask device according to the embodiment of the present disclosure, the frame may include an outside surface extending between the front surface and the back surface, and may be provided with a connection surface that connects the front surface and the outside surface between the front surface and the outside surface.

In the method of manufacturing the vapor deposition mask device according to the embodiment of the present disclosure, a profile of the connection surface may have at least partly an arcuate shape protuberant toward the vapor deposition mask, as viewed in a section along a normal direction of the first surface, and a radius of curvature of the arcuate shape may be equal to or more than 0.1 mm.

According to the embodiment of the present disclosure, there is provided an apparatus for manufacturing a vapor deposition mask device that includes a vapor deposition mask including a plurality of through-holes extending from a first surface to a second surface and a frame including a front surface facing the second surface of the vapor deposition mask and a back surface opposite to the front surface, the apparatus including: a jig that supports the vapor deposition mask; and a stage that is in close contact with the frame, in which the vapor deposition mask has a pair of ear parts constituting a pair of end portions, each of the pair of ear parts includes a weld section welded to the front surface of the frame, and an extension section located between the weld section and the end portion of the vapor deposition mask, the jig supports the extension section of the vapor deposition mask, and in a state in which the jig supports the vapor deposition mask, the second surface of the weld section is in close contact with the front surface of the frame, and the second surface of the extension section is at least partly located toward the back surface of the frame rather than the front surface of the frame.

In the apparatus for manufacturing the vapor deposition mask device according to the embodiment of the present disclosure, the stage may be movable in a normal direction of the first surface.

In the apparatus for manufacturing the vapor deposition mask device according to the embodiment of the present disclosure, the jig may be a clamp that clamps the extension section of the vapor deposition mask.

In the apparatus for manufacturing the vapor deposition mask device according to the embodiment of the present disclosure, the clamp may have a first clamp that clamps the extension section of one of the pair of ear parts of the vapor deposition mask, and a second clamp that clamps the extension section of the other of the pair of ear parts.

In the apparatus for manufacturing the vapor deposition mask device according to the embodiment of the present disclosure, at least one of the first clamp and the second clamp may be movable in a normal direction of the first surface.

In the apparatus for manufacturing the vapor deposition mask device according to the embodiment of the present disclosure, at least one of the first clamp and the second clamp may be movable in a plane direction of the first surface.

In the apparatus for manufacturing the vapor deposition mask device according to the embodiment of the present disclosure, the frame may include an outside surface extending between the front surface and the back surface, and may be provided with a connection surface that connects the front surface and the outside surface between the front surface and the outside surface.

In the apparatus for manufacturing the vapor deposition mask device according to the embodiment of the present disclosure, a profile of the connection surface may have at least partly an arcuate shape protuberant toward the vapor deposition mask, as viewed in a section along a normal direction of the first surface, and a radius of curvature of the arcuate shape may be equal to or more than 0.1 mm.

The apparatus for manufacturing the vapor deposition mask device according to the embodiment of the present disclosure may further include a welding device to join the vapor deposition mask and the frame to each other.

According to the embodiment of the present disclosure, there is provided a method of manufacturing a vapor deposition mask device, the vapor deposition mask device including: a vapor deposition mask that has a first surface, a second surface opposite to the first surface, and a plurality of through-holes extending from the first surface to the second surface; and a frame having a third surface and a fourth surface opposite to the third surface, the method of manufacturing a vapor deposition mask device including: a step of preparing the vapor deposition mask; a step of applying tension to the vapor deposition mask, in a state in which at least part of the second surface is in close contact with the third surface, and at least part of the second surface of a part of the vapor deposition mask, which does not overlap with the frame as viewed from a normal direction of the first surface, is located toward the fourth surface rather than the third surface; and a step of welding the vapor deposition mask to the frame.

In the method of manufacturing the vapor deposition mask device according to the embodiment of the present disclosure, in the step of welding the vapor deposition mask to the frame, laser light may be applied from the first surface.

In the method of manufacturing the vapor deposition mask device according to the embodiment of the present disclosure, in the step of applying the tension to the vapor deposition mask, the frame may be moved in the normal direction of the first surface.

In the method of manufacturing the vapor deposition mask device according to the embodiment of the present disclosure, in the step of applying the tension to the vapor deposition mask, the vapor deposition mask may be supported by a jig.

In the method of manufacturing the vapor deposition mask device according to the embodiment of the present disclosure, the jig may be a clamp.

In the method of manufacturing the vapor deposition mask device according to the embodiment of the present disclosure, the clamp may have a first clamp, and a second clamp located on an opposite side from the first clamp with respect to the vapor deposition mask.

In the method of manufacturing the vapor deposition mask device according to the embodiment of the present disclosure, in the step of applying the tension to the vapor deposition mask, at least one of the first clamp and the second clamp may be moved in the normal direction of the first surface.

In the method of manufacturing the vapor deposition mask device according to the embodiment of the present disclosure, in the step of applying the tension to the vapor deposition mask, at least one of the first clamp and the second clamp may be moved along a plane direction of the first surface of the vapor deposition mask.

In the method of manufacturing the vapor deposition mask device according to the embodiment of the present disclosure, the frame may include a fifth surface extending between the third surface and the fourth surface, and may be provided with a sixth surface that connects the third surface and the fifth surface between the third surface and the fifth surface.

In the method of manufacturing the vapor deposition mask device according to the embodiment of the present disclosure, a profile of the sixth surface may have at least partly an arcuate shape protuberant toward the vapor deposition mask, as viewed in a section along the normal direction of the first surface, and a radius of curvature of the arcuate shape may be equal to or more than 0.1 mm.

According to the embodiment of the present disclosure, there is provided an apparatus for manufacturing a vapor deposition mask device, the vapor deposition mask device including: a vapor deposition mask that has a first surface, a second surface opposite to the first surface, and a plurality of through-holes extending from the first surface to the second surface; and a frame having a third surface and a fourth surface opposite to the third surface, the apparatus including: a jig that supports the vapor deposition mask; and a stage that is in close contact with the frame, in which at least part of the second surface of the vapor deposition mask is in close contact with the third surface, and at least part of the second surface of a part of the vapor deposition mask, which does not overlap with the frame as viewed from a normal direction of the first surface, is located toward the fourth surface rather than the third surface.

In the apparatus for manufacturing the vapor deposition mask device according to the embodiment of the present disclosure, the stage may be movable in the normal direction of the first surface.

In the apparatus for manufacturing the vapor deposition mask device according to the embodiment of the present disclosure, the jig may be a clamp.

In the apparatus for manufacturing the vapor deposition mask device according to the embodiment of the present disclosure, the clamp may have a first clamp, and a second clamp that is located on an opposite side from the first clamp with respect to the vapor deposition mask.

In the apparatus for manufacturing the vapor deposition mask device according to the embodiment of the present disclosure, at least one of the first clamp and the second clamp may be movable in the normal direction of the first surface.

In the apparatus for manufacturing the vapor deposition mask device according to the embodiment of the present disclosure, at least one of the first clamp and the second clamp may be movable along a plane direction of the first surface.

In the apparatus for manufacturing the vapor deposition mask device according to the embodiment of the present disclosure, the frame may include a fifth surface extending between the third surface and the fourth surface, and may be provided with a sixth surface that connects the third surface and the fourth surface between the third surface and the fourth surface.

In the apparatus for manufacturing the vapor deposition mask device according to the embodiment of the present disclosure, a profile of the sixth surface may have at least partly an arcuate shape protuberant toward the vapor deposition mask, as viewed in a section along the normal direction of the first surface, and a radius of curvature of the arcuate shape may be equal to or more than 0.1 mm.

The apparatus for manufacturing the vapor deposition mask device according to the embodiment of the present disclosure may further include a welding device to join the vapor deposition mask and the frame to each other.

In accordance with the embodiment of the present disclosure, generation of flexure or a wavy shape in the vapor deposition mask can be restrained.

BRIEF DESCRIPTION OF DRAWINGS

FIG. 1A is a diagram illustrating a vapor deposition device including a vapor deposition mask device according to a embodiment of the present disclosure.
FIG. 1B is a sectional view depicting an organic EL display device manufactured using the vapor deposition mask device illustrated in FIG. 1A.
FIG. 2 is a plan view depicting a vapor deposition mask device according to the embodiment of the present disclosure.
FIG. 3 is a plan view (a plan view corresponding to part III of FIG. 2) depicting, in an enlarged form, an ear part of the vapor deposition mask device illustrated in FIG. 2.
FIG. 4A is a plan view depicting a modification of a joint formed in the ear part of the vapor deposition mask device.
FIG. 4B is a plan view depicting another modification of the joint formed in the ear part of the vapor deposition mask device.
FIG. 4C is a plan view depicting still another modification of the joint formed in the ear part of the vapor deposition mask device.
FIG. 4D is a plan view depicting yet another modification of the joint formed in the ear part of the vapor deposition mask device.
FIG. 4E is a plan view depicting further modification of the joint formed in the ear part of the vapor deposition mask device.
FIG. 5A is a sectional view, taken along direction VA-VA, of the vapor deposition mask device of FIG. 3.
FIG. 5B is a sectional view (a sectional view corresponding to part VB of FIG. 5) depicting, in an enlarged form, a weld mark illustrated in FIG. 5A.
FIG. 5C is a sectional view depicting a modification of the weld mark.
FIG. 5D is a sectional view depicting another modification of the weld mark.
FIG. 6 is a plan view depicting, in an enlarged form, an intermediate part of the vapor deposition mask.

FIG. 7 is a sectional view, taken along direction VII-VII, of the intermediate part of FIG. 6.

FIG. 8 is a plan view illustrating an apparatus for manufacturing a vapor deposition mask device according to the embodiment of the present disclosure.

FIG. 9A is a sectional view, taken along direction IX-IX, of the apparatus for manufacturing a vapor deposition mask device of FIG. 8.

FIG. 9B is a sectional view depicting, in an enlarged form, a clamp of FIG. 9A.

FIG. 9C is a sectional view for explaining a fixed section and a movable section of the clamp of FIG. 9A.

FIG. 9D is a plan view illustrating one modification of the fixed section and the movable section of the clamp.

FIG. 10 is a diagram depicting a step of obtaining a metallic plate having a desired thickness by rolling a base material.

FIG. 11 is a diagram depicting a step of annealing the metallic plate obtained by the rolling.

FIG. 12 is a schematic diagram for generally explaining one example of a method of manufacturing a vapor deposition mask.

FIG. 13 is a diagram depicting a step of forming a resist pattern on the metallic plate.

FIG. 14 is a diagram depicting a first surface etching step.

FIG. 15 is a diagram depicting a second surface etching step

FIG. 16 is a diagram depicting a step of removing a resin and the resist pattern from the metallic plate.

FIG. 17A is a diagram illustrating a welding step.

FIG. 17B is another diagram illustrating the welding step.

FIG. 17C is a diagram depicting one example of a method of measuring a weld strength of the joint.

FIG. 18A is a diagram illustrating the welding step according to the embodiment of the present disclosure.

FIG. 18B is another diagram illustrating the welding step according to the embodiment of the present disclosure.

FIG. 19A is still another diagram illustrating the welding step according to the embodiment of the present disclosure.

FIG. 19B is yet another diagram illustrating the welding step according to the embodiment of the present disclosure.

FIG. 20A is a diagram depicting a step of vapor depositing a vapor deposition material on an organic EL substrate.

FIG. 20B is another diagram depicting the step of vapor depositing the vapor deposition material on the organic EL substrate.

FIG. 21 is still another diagram depicting the step of vapor depositing the vapor deposition material on the organic EL substrate.

FIG. 22A is a sectional view depicting a modification of the frame.

FIG. 22B is a sectional view depicting another modification of the frame.

FIG. 22C is a sectional view depicting still another modification of the frame.

FIG. 22D is a sectional view depicting yet another modification of the frame.

FIG. 23 is a sectional view depicting a modification of the apparatus for manufacturing the vapor deposition mask device.

FIG. 24 is a sectional view depicting a modification of the apparatus for manufacturing the vapor deposition mask device.

FIG. 25 is a sectional view depicting a modification of the apparatus for manufacturing the vapor deposition mask device.

FIG. 26A is a sectional view depicting a modification of the apparatus for manufacturing the vapor deposition mask device.

FIG. 26B is a sectional view depicting a modification of the apparatus for manufacturing the vapor deposition mask device.

FIG. 27 is a sectional view depicting a modification of the apparatus for manufacturing the vapor deposition mask device.

FIG. 28 is a sectional view depicting a modification of the apparatus for manufacturing the vapor deposition mask device.

FIG. 29 is a sectional view depicting a modification of the apparatus for manufacturing the vapor deposition mask device.

FIG. 30 is a sectional view depicting a modification of the apparatus for manufacturing the vapor deposition mask device.

FIG. 31 is a sectional view depicting a modification of the apparatus for manufacturing the vapor deposition mask device.

FIG. 32 is a sectional view depicting a modification of the apparatus for manufacturing the vapor deposition mask device.

FIG. 33 is a sectional view depicting a modification of the apparatus for manufacturing the vapor deposition mask device.

FIG. 34 is a sectional view depicting a modification of the apparatus for manufacturing the vapor deposition mask device.

MODE FOR CARRYING OUT THE INVENTION

Figure 1A:
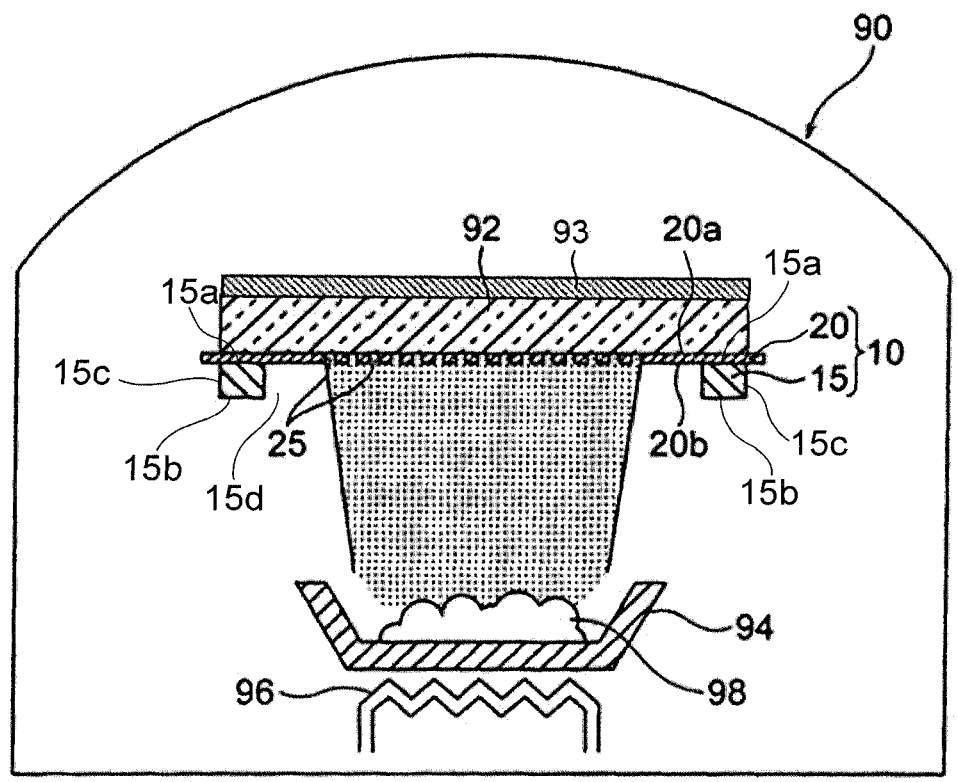
[FIG. 1A]

An embodiment of the present disclosure will be described below referring to the drawings. Note that in the drawings attached herein, for convenience of illustration and understandability, the scales and aspect ratios and the like may be modified from the actual ones and exaggerated.

Note that the embodiments described below are examples of the embodiments of the present disclosure, and the present disclosure is not to be construed as limited to these embodiments. In addition, the following embodiments and modifications may be applied in appropriate combinations. Besides, it is possible to combine a plurality of embodiments, to combine a plurality of modifications, and to combine a plurality of embodiments and a plurality of modifications.

FIGS. 1A to 21 are diagrams for illustrating an embodiment of the present disclosure. In the following embodiment and modifications thereof, description will be made by taking as an example a method of manufacturing a vapor deposition mask for use in patterning an organic material in a desired pattern on a substrate at the time of manufacturing an organic EL display device. It is to be noted, however, that the present disclosure can be applied to methods of manufacturing vapor deposition masks for various uses, without being limited to such an application.

Note that herein the terms of "plate", "sheet" and "film" are not discriminated from each other based only on the difference in designation. For example, "plate" is a concept including members which may be called sheet or film.

In addition, "plate surface (sheet surface, film surface)" refers to a surface coinciding with planar directions of a plate-shaped member (sheet-shaped member, film-shaped member) which is a target where a target plate-shaped (sheet-shaped, film-shaped) member is viewed as a whole or in perspective. Besides, a normal direction used in regard of a plate-shaped (sheet-shaped, film-shaped) member refers to the direction of a normal to the plate surface (sheet surface, film surface) of the member.

Further, terms specifying shapes, geometrical conditions, physical properties and extents thereof, for example, "parallel," "orthogonal," "identical," and "equivalent" as well as the values of length, angle and physical properties and the like, which are used in the specification, are not bound to the strict meanings, but are to be construed as including ranges of extents such that similar functions can be expected.

Vapor Deposition Device

First, a vapor deposition device 90 for carrying out a vapor deposition treatment of vapor depositing a vapor deposition material on a target will be described referring to FIG. 1A. As depicted in FIG. 1A, the vapor deposition device 90 includes a vapor deposition source (for example, a crucible 94), a heater 96, and a vapor deposition mask device 10. The crucible 94 accommodates a vapor deposition material 98 such as an organic light-emitting material. The heater 96 heats the crucible 94 to evaporate the vapor deposition material 98. The vapor deposition mask device 10 is disposed opposite to the crucible 94.

Vapor Deposition Mask Device

The vapor deposition mask device 10 will be described below. As illustrated in FIG. 1A, the vapor deposition mask device 10 includes a vapor deposition mask 20, and a frame 15 that supports the vapor deposition mask 20. The frame 15 supports the vapor deposition mask 20 in a state of pulling the vapor deposition mask 20 in plane directions of the latter such that the vapor deposition mask 20 will not be bent. As depicted in FIG. 1A, the vapor deposition mask device 10 is disposed inside the vapor deposition device 90 in such a manner that the vapor deposition mask 20 faces a substrate as a target on which to deposit the vapor deposition material 98, for example, an organic EL substrate 92. In the following description, of surfaces of the vapor deposition mask 20, a surface on the organic EL substrate 92 side will be referred to as a first surface 20a, whereas a surface located opposite to the first surface 20a will be referred to as a second surface 20b. A front surface 15a of the frame 15 faces the second surface 20b of the vapor deposition mask 20.

As illustrated in FIG. 1A, the vapor deposition mask device 10 may include a magnet 93 disposed on that surface of the organic EL substrate 92 which is the side opposite to the vapor deposition mask 20. With the magnet 93 provided, it is possible to attract the vapor deposition mask 20 toward the magnet 93 side by a magnetic force, thereby putting the vapor deposition mask 20 in close contact with the organic EL substrate 92.

Figure 2:
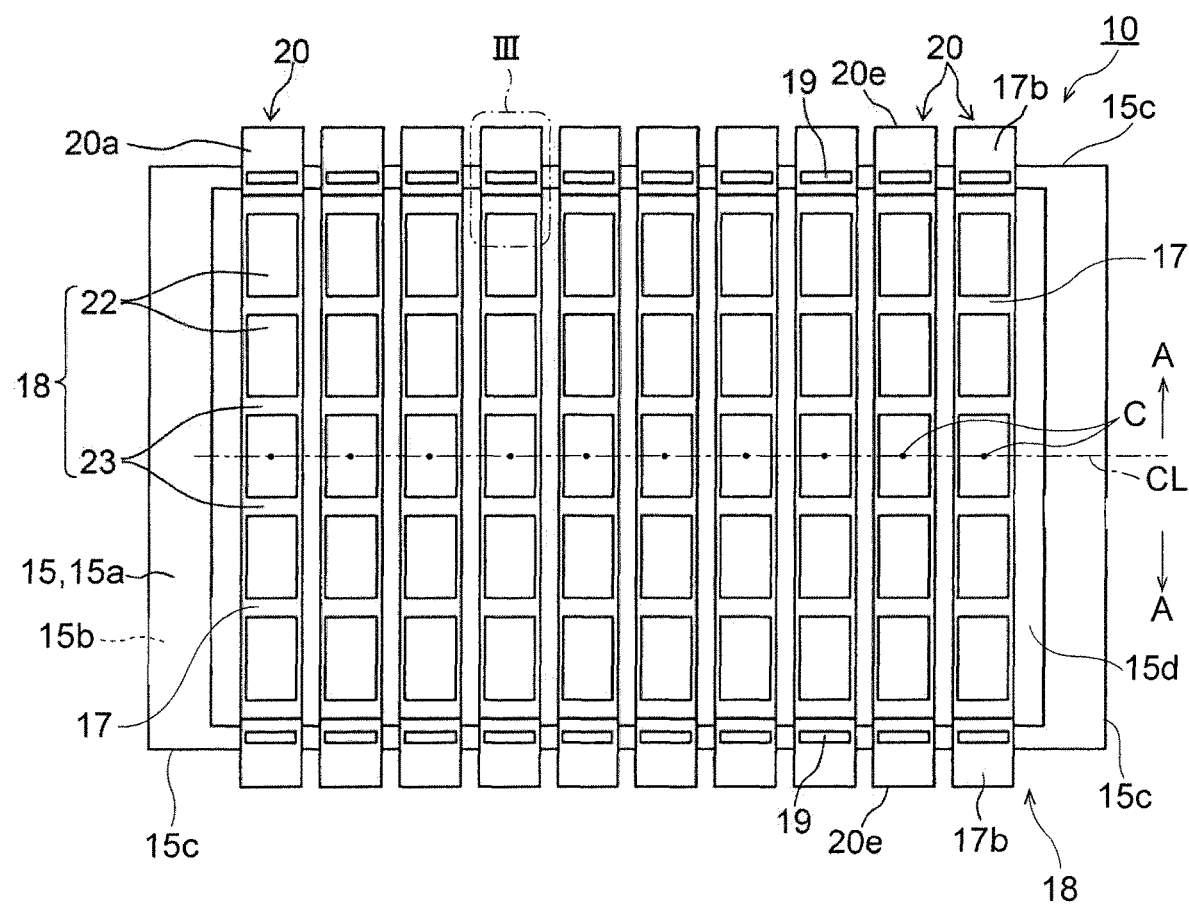
[FIG. 2]

FIG. 2 is a plan view of the vapor deposition mask device 10, as viewed from the first surface 20a side of the vapor deposition mask 20. As depicted in FIG. 2, the vapor deposition mask device 10 includes a plurality of vapor deposition masks 20 having a substantially rectangular shape in plan view. Each vapor deposition mask 20 is fixed to the frame 15 by welding, at weld sections 17a, described later, located in the vicinity of a pair of end portions 20e in the longitudinal direction of the vapor deposition mask 20.

As illustrated in FIG. 1A, the vapor deposition mask 20 includes a plurality of through-holes 25 penetrating the vapor deposition mask 20. The vapor deposition material 98 evaporated from the crucible 94 and reaching the vapor deposition mask device 10 passes through the through-holes 25 of the vapor deposition mask 20, to be deposited on the organic EL substrate 92. By this, a film of the vapor deposition material 98 can be formed on the surface of the organic EL substrate 92, in a desired pattern corresponding to the positions of the through-holes 25 of the vapor deposition mask 20.

Figure 1B:
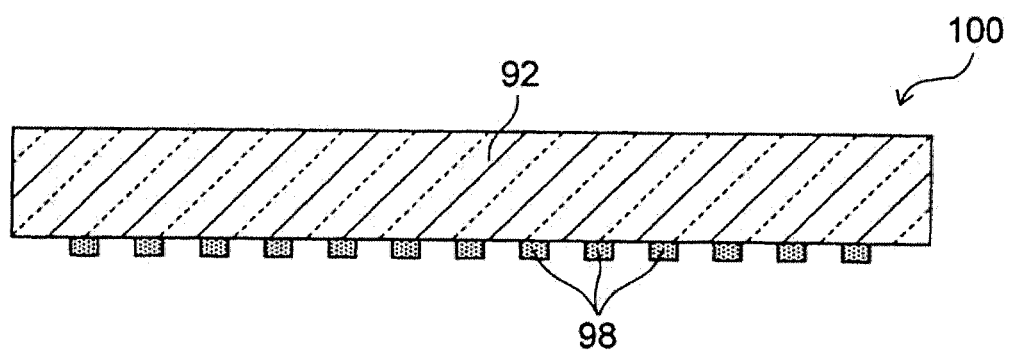
[FIG. 1B]

FIG. 1B is a sectional view depicting an organic EL display device 100 manufactured by using the vapor deposition device 90 of FIG. 1A. The organic EL display device 100 includes the organic EL substrate 92, and pixels including the vapor deposition material 98 provided in a pattern. Note that in the organic EL display device 100 of FIG. 1B, electrodes for applying a voltage on the pixels including the vapor deposition material 98 and the like are omitted. In addition, after a vapor deposition step of providing the vapor deposition material 98 in a pattern on the organic EL substrate 92, the organic EL display device 100 of FIG. 1B may be provided further with other components of the organic EL display device. Therefore, the organic EL display device 100 of FIG. 1B may be called an intermediate of the organic EL display device.

Note that in a case where color display by a plurality of colors is to be performed, the vapor deposition devices 90 on each of which the vapor deposition mask 20 corresponding to each color is mounted are respectively prepared, and the organic EL substrate 92 is sequentially put into the vapor deposition devices 90. By this, for example, an organic light-emitting material for red color, an organic light-emitting material for green color and an organic light-emitting material for blue color can be sequentially vapor deposited on the organic EL substrate 92.

Incidentally, the vapor deposition treatment may be carried out in the vapor deposition device 90 involving a high-temperature atmosphere. In this case, during the vapor deposition treatment, the vapor deposition mask 20, the frame 15 and the organic EL substrate 92 which are held in the inside of the vapor deposition device 90 are also heated. In this instance, the vapor deposition mask 20, the frame 15 and the organic EL substrate 92 show behaviors of dimensional changes based on their thermal expansion coefficients. In this case, if the thermal expansion coefficients of the vapor deposition mask 20 and the frame 15 and the organic EL substrate 92 are largely different from one another, misregistration due to the differences in their dimensional changes is generated, resulting in that the dimensional accuracy and/or the positional accuracy of the vapor deposition material deposited on the organic EL substrate 92 would be lowered.

In order to solve such a problem, it is preferable that the thermal expansion coefficients of the vapor deposition mask 20 and the frame 15 are equivalent to the thermal expansion coefficient of the organic EL substrate 92. For example, in a case where a glass substrate is used as the organic EL substrate 92, a nickel-containing iron alloy can be used as a main material of the vapor deposition mask 20 and the frame 15. The iron alloy may further contain cobalt in addition to nickel. For instance, an iron alloy having a total content of nickel and cobalt equal to or more than 30% to equal to or less than 50% by weight and having a cobalt content equal to or more than 0% to equal to or less than 6% by weight can be used as the material of a metallic plate constituting the vapor deposition mask 20. Specific examples of the iron alloy containing nickel or containing nickel and cobalt include an invar material containing 34% or more to 38% or less by weight of nickel, a super invar material further containing cobalt in addition to 30% or more to 34% or less by weight of nickel, and a low thermal expansion Fe—Ni based plated alloy containing 48% or more to 54% or less by weight of nickel.

Note that in a case where the temperatures of the vapor deposition mask 20, the frame 15 and the organic EL substrate 92 do not reach high temperatures at the time of the vapor deposition treatment, it is not particularly necessary for the thermal expansion coefficients of the vapor deposition mask 20 and the frame 15 to be made equivalent to the thermal expansion coefficient of the organic EL substrate 92. In this case, as the material constituting the vapor deposition mask 20, other materials than the aforementioned iron alloys may be used. For instance, an iron alloy other than the aforementioned nickel-containing alloys, such as a chromium-containing iron alloy may be used. As the chromium-containing iron alloy, the iron alloy so called stainless steel can be used. In addition, alloys other than the iron alloys, such as nickel or nickel-cobalt alloys may also be used.

Vapor Deposition Mask

Next, the details of the vapor deposition mask 20 will be described. As illustrated in FIG. 2, the vapor deposition mask 20 includes a pair of ear parts 17 constituting a pair of end portions 20e in the longitudinal direction of the vapor deposition mask 20, and an intermediate part 18 located between the pair of ear parts 17.

Ear Part

First, the ear parts 17 will be described in detail. The ear parts 17 are those parts of the vapor deposition mask 20 which are fixed to the frame 15. In the present embodiment, the ear parts 17 are fixed to the frame 15 by welding on the second surface 20b side. In the following description, a part of the ear part 17 and the frame 15, which are joined to each other by welding, will be referred to as a joint 19.

Figure 3:
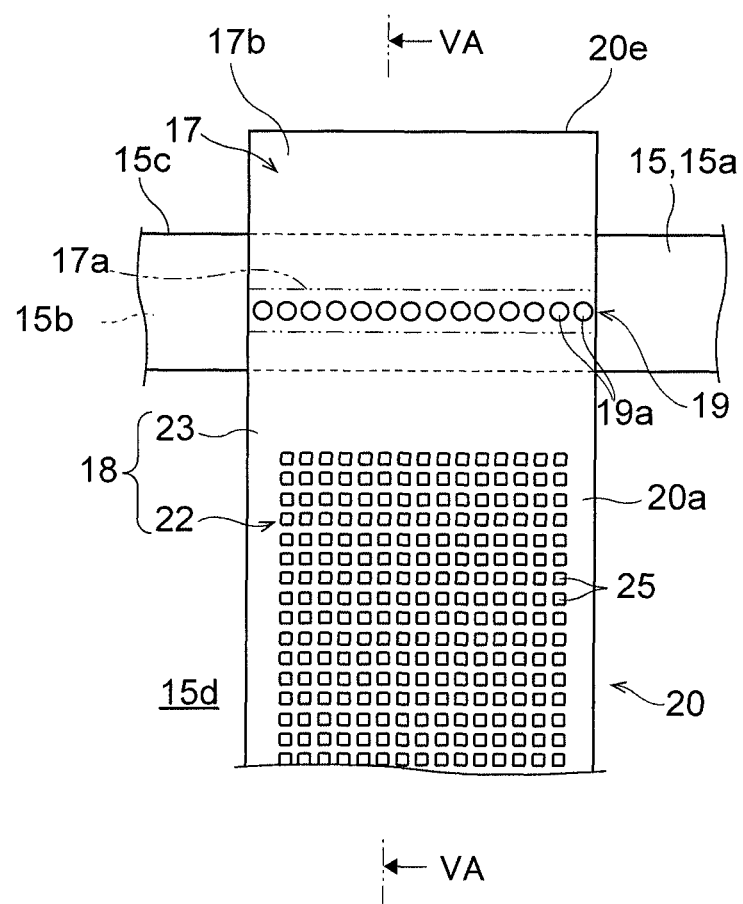
[FIG. 3]

FIG. 3 is a plan view illustrating, in an enlarged form, the ear part 17 and the surrounding part thereof of the vapor deposition mask device 10. The ear part 17 includes the weld section 17a welded to the front surface 15a of the frame 15, and an extension section 17b located between the weld section 17a and the end portion 20e of the vapor deposition mask 20. In the present embodiment, the weld section 17a corresponds to a region surrounded by imaginary lines (alternate long and two short dashes lines) in FIG. 3, in the longitudinal direction of the vapor deposition mask 20, whereas the extension section 17b corresponds to a region between an imaginary line on the end portion 20e side, of the imaginary lines (alternate long and two short dashes lines) in FIG. 3, and the end portion 20e. Of these, the weld section 17a is a section where the joint 19 is formed. The joint 19 formed at the weld section 17a of the ear part 17 includes weld marks 19a. The weld marks 19a are marks formed at part of the vapor deposition mask 20 and the frame 15, due to welding of the second surface 20b of the vapor deposition mask 20 to the frame 15. For example, as depicted in FIG. 3, the joint 19 includes a plurality of dot-like weld marks 19a arrayed along the width direction of the vapor deposition mask 20. Such a plurality of dot-like weld marks 19a are formed, for example, by intermittently applying laser light in a dot form to the ear part 17 by a welding device 76, described later, at each of the positions along the width direction of the vapor deposition mask 20.

Figure 4A:
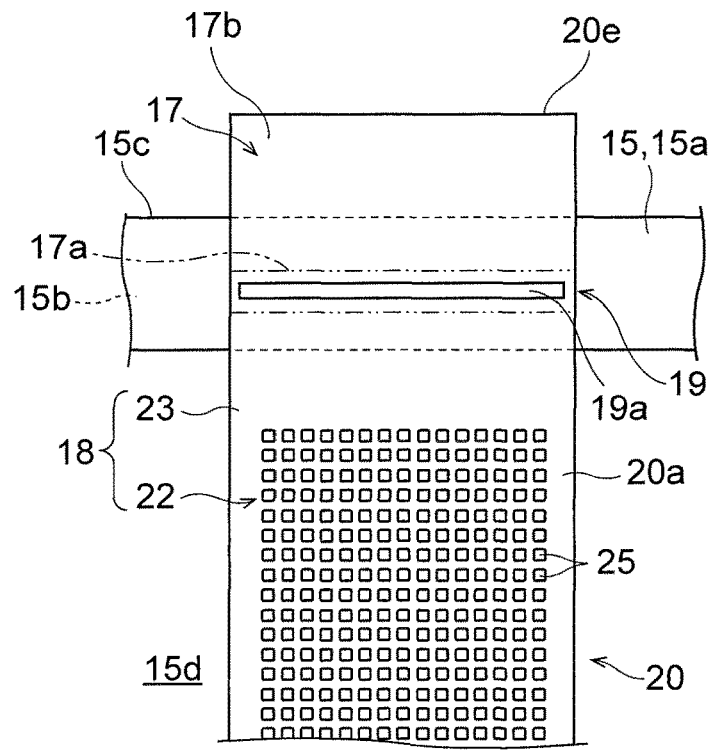
[FIG. 4A]

Note that the layout and shape of the weld marks 19a in plan view are not particularly limited. For example, as illustrated in FIG. 4A, the weld mark 19a may extend in a line form along the width direction of the vapor deposition mask 20. Such a weld mark 19a is formed, for example, by continuously applying laser light in a line form to the ear part 17 at each of the positions along the width direction of the vapor deposition mask 20. In this case, since the weld mark 19a extends in a line form along the width direction of the vapor deposition mask 20, a weld strength can be enhanced.

Figure 4B:
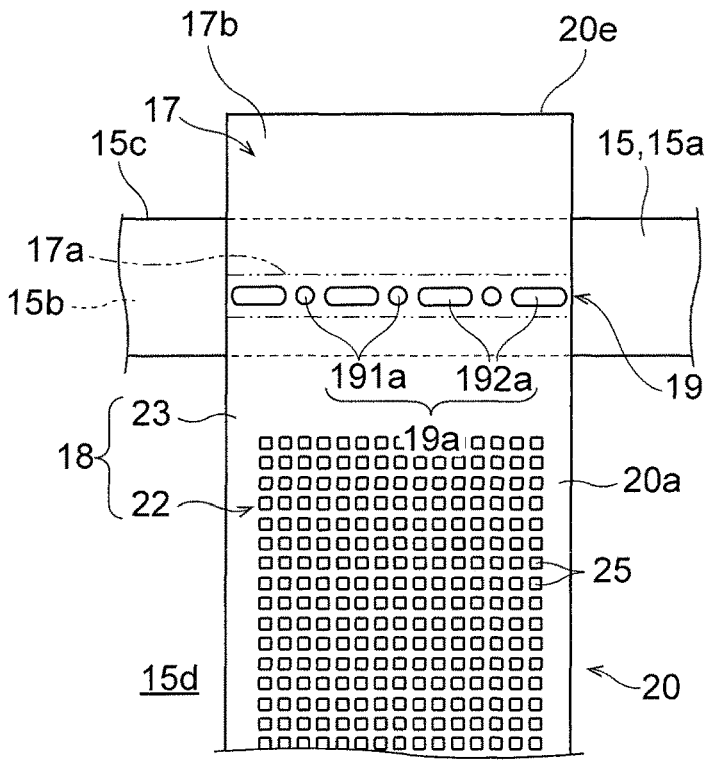
[FIG. 4B]

In addition, for example, as depicted in FIG. 4B, the weld marks 19a may include first weld marks 191a formed in a dot form, and second weld marks 192a formed in a line form. In the example illustrated, the weld marks 19a include a plurality of first weld marks 191a and a plurality of second weld marks 192a, and the first weld marks 191a and the second weld marks 192a are disposed regularly, that is, alternately, along the width direction of the vapor deposition mask 20. In this case, for example, the second weld marks 192a may differ from one another in shape. In addition, the first weld mark 191a may be only one, or the second weld mark 192a may be only one. In this case, also, since the weld marks 19a include the second weld mark 192a formed in a line form, the weld strength can be enhanced.

Figure 4C:
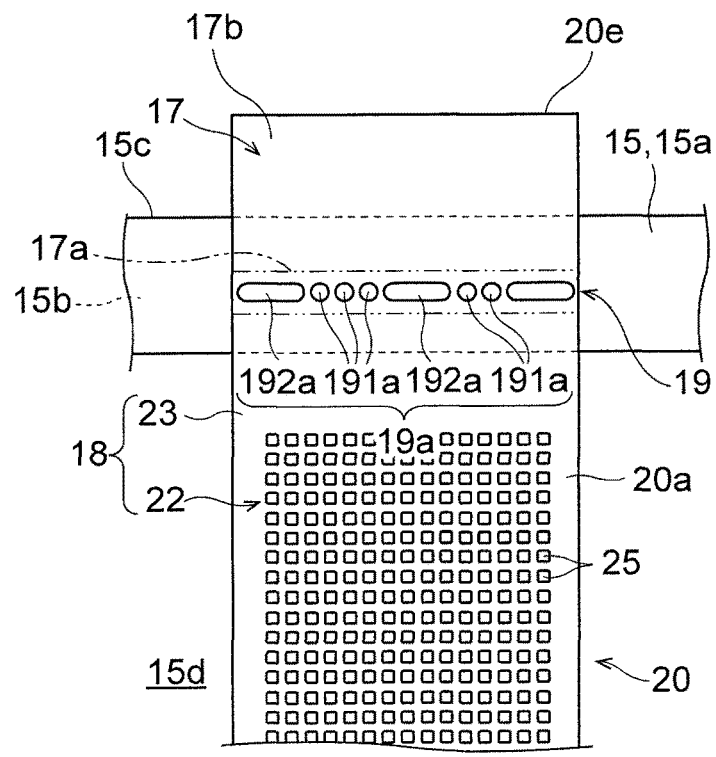
[FIG. 4C]

Besides, for example, as illustrated in FIG. 4C, the first weld marks 191a and the second weld marks 192a may be irregularly disposed along the width direction of the vapor deposition mask 20. In the example illustrated, the numbers of the first weld marks 191a disposed between the second weld marks 192a adjacent to each other in the width direction of the vapor deposition mask 20 are different from one another. Note that in this case, also, for example, the shapes of the second weld marks 192a may be different from one another. Besides, the number of the first weld marks 191a disposed between the second weld marks 192a adjacent to each other in the width direction of the vapor deposition mask 20 is arbitrary. In this case, for example, at a part where the weld strength of the vapor deposition mask 20 is to be raised, the density of the weld marks 19a may be selectively enhanced.

Figure 4D:
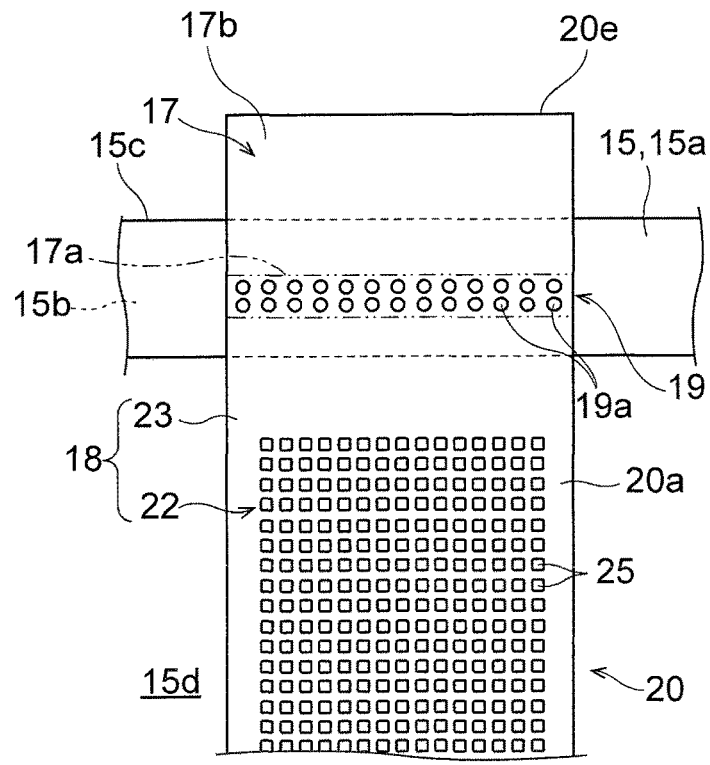
[FIG. 4D]

In addition, for example, as depicted in FIG. 4D, the plurality of dot-like weld marks 19a may be formed in multiple rows along the width direction of the vapor deposition mask 20. In the example illustrated, the weld marks 19a are formed in two rows along the width direction of the vapor deposition mask 20. Note that the weld marks 19a may be formed in three rows, or in four rows, along the width direction of the vapor deposition mask 20. In this case, with the plurality of dot-like weld marks 19a formed in multiple rows along the width direction of the vapor deposition mask 20, the weld strength can be enhanced.

Figure 4E:
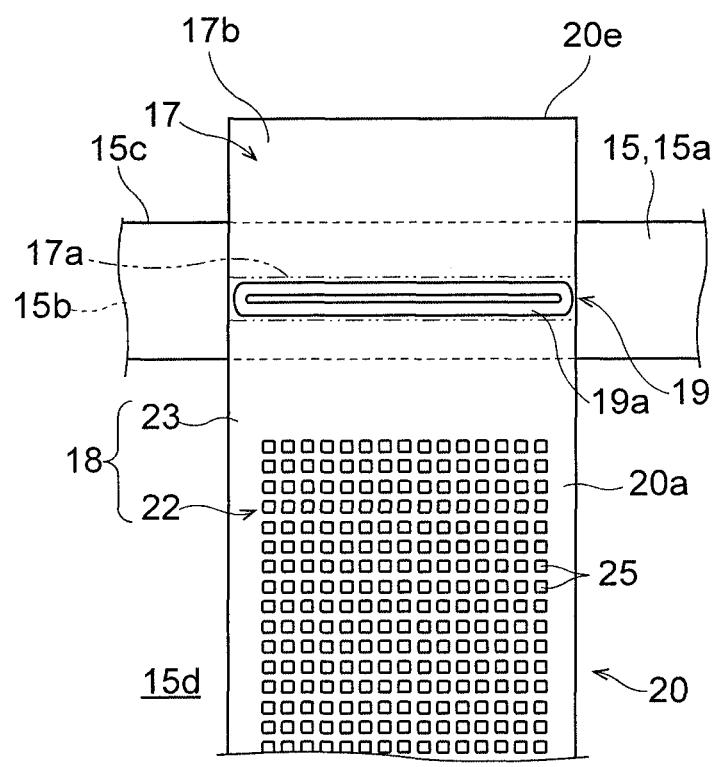
[FIG. 4E]

Further, for example, as illustrated in FIG. 4E, the weld mark 19a may be formed in a frame form along the width direction of the vapor deposition mask 20. In this case, also, with the weld marks 19a formed along the width direction of the vapor deposition mask 20, the weld strength can be enhanced.

Figure 5A:
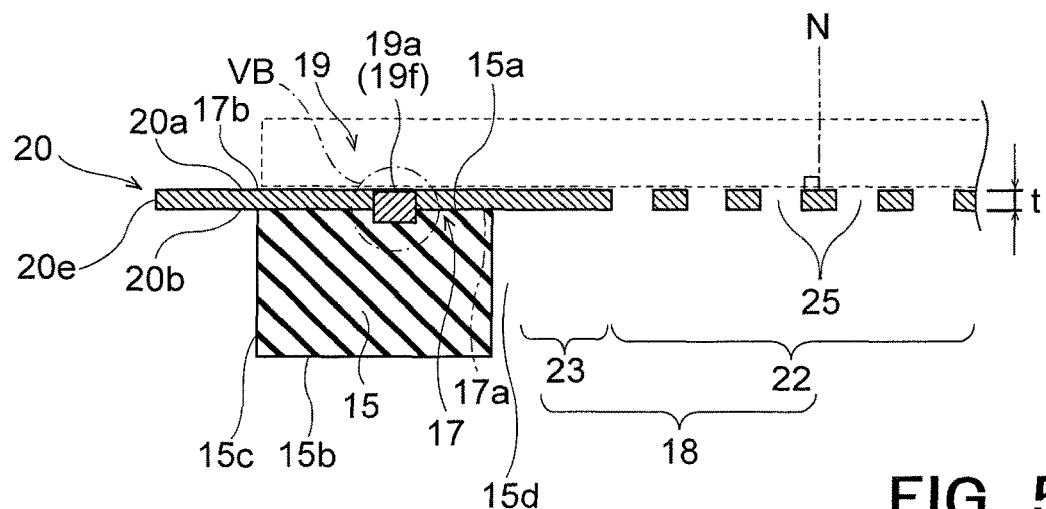
[FIG. 5A]
Figure 5B:
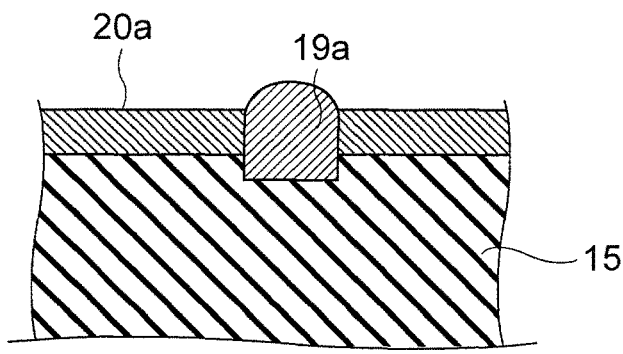
[FIG. 5B]

FIG. 5A is a sectional view, taken along direction VA-VA, of the vapor deposition mask device of FIG. 3. As depicted in FIG. 5A, the weld mark 19a extends from the first surface 20a through the second surface 20b of the ear part 17 to the frame 15. The weld mark 19a is a part of the ear part 17 of the vapor deposition mask 20 and the frame 15, which are melted at the time of welding (namely, a molten region 19f) have been solidified, and includes part extending from the first surface 20a to the second surface 20b of the ear part 17 and part of the frame 15. In the weld mark 19a, the ear part 17 of the vapor deposition mask 20 and the frame 15 are joined to each other. In the weld mark 19a, crystallization of material is generated when the temperature of the molten region 19f is lowered and the molten region 19f is solidified, after the welding. For example, the weld mark 19a includes crystal grains lying in both the ear part 17 and the frame 15. The weld mark 19a may, for example, be formed in such a manner as to project from the first surface 20a of the vapor deposition mask 20, as depicted in FIG. 5B.

Figure 5C:
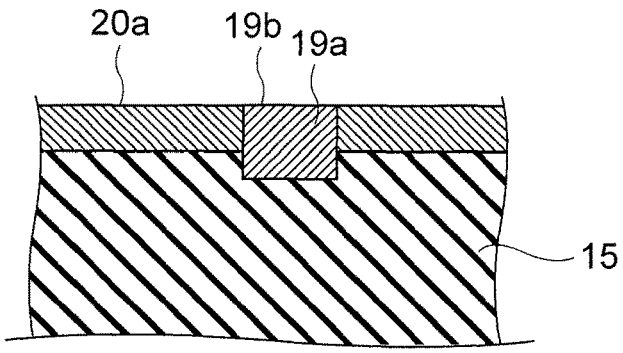
[FIG. 5C]
Figure 5D:
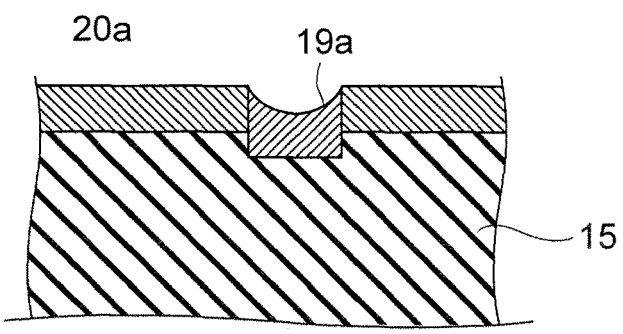
[FIG. 5D]

In addition, the weld mark 19a may be formed such that an upper surface 19b of the weld mark 19a is located flush with the first surface 20a of the vapor deposition mask 20, as illustrated in FIG. 5C. Further, the weld mark 19a may be formed such as to be hollowed to the second surface 20b side as compared to the first surface 20a of the vapor deposition mask 20, as depicted in FIG. 5D. In these cases, at the time of vapor depositing the vapor deposition material 98 on the organic EL substrate 92, adhesion between the vapor deposition mask 20 and the organic EL substrate 92 can be enhanced.

Besides, as illustrated in FIGS. 2 to 5A, the extension section 17b extends to an outer side than an outside surface 15c, described later, of the frame 15. As depicted by arrow A in FIG. 2, the "outer side" refers to the side of coming away from a center line CL of the vapor deposition mask 20 in the longitudinal direction of the vapor deposition mask 20. Here, the center line CL of the vapor deposition mask 20 is a straight line passing through an intermediate point C (see FIG. 2) of equally bisecting the part between the pair of end portions 20e in the longitudinal direction of the vapor deposition mask 20, of straight lines extending in a direction orthogonal to the longitudinal direction of the vapor deposition mask 20. This extension section 17b is a section supported by a jig 700, described later; in the present embodiment, the extension section 17b is a section clamped by a clamp 72.

Note that in FIG. 5A, the organic EL substrate 92 are in close contact with the vapor deposition mask 20 at the time of the vapor deposition treatment is depicted by dotted line. As illustrated in FIG. 5A, the organic EL substrate 92 may extend to a part of the vapor deposition mask 20 at which the joint 19 is formed.

Intermediate Part

Next, the intermediate part 18 will be described. As illustrated in FIGS. 2, 3 and 5A, the intermediate part 18 includes an effective region 22 in which the through-holes 25 extending from the first surface 20a to the second surface 20b are formed, and a peripheral region 23 surrounding the effective region 22. The peripheral region 23 is a region for supporting the effective region 22, and is not a region where the vapor deposition material to be vapor deposited on the organic EL substrate 92 passes. For instance, the effective region 22 is the region of the vapor deposition mask 20 which faces a display region of the organic EL substrate 92.

As depicted in FIG. 2, the effective region 22 has a profile which is, for example, substantially tetragonal in plan view, more accurately, substantially rectangular in plan view. Note that though not illustrated, each effective region 22 may have any of variously shaped profiles, according to the shape of the display region of the organic EL substrate 92. For example, each effective region 22 may have a circular profile.

As illustrated in FIG. 2, the intermediate part 18 includes a plurality of effective regions 22 arrayed at predetermined intervals in the longitudinal direction of the vapor deposition mask 20. One effective region 22 corresponds to one display region of the organic EL display device 100. Therefore, according to the vapor deposition mask device 10 illustrated in FIG. 1A, multifaceted vapor deposition of the organic EL display device 100 can be performed.

Figure 6:
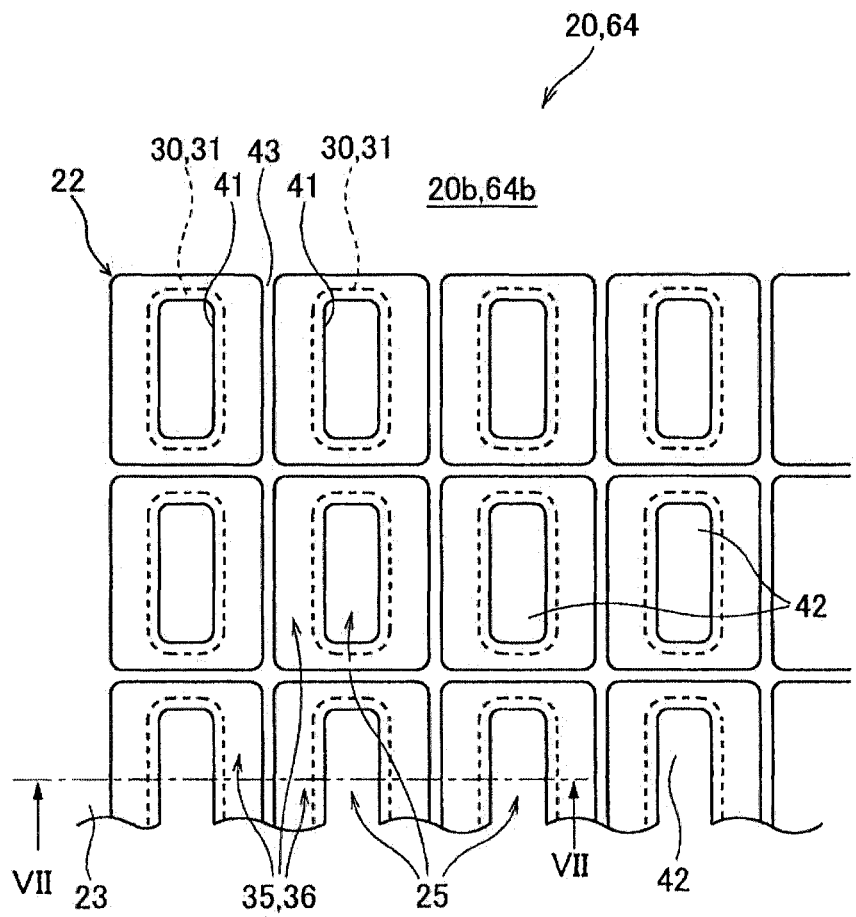
[FIG. 6]
Figure 7:
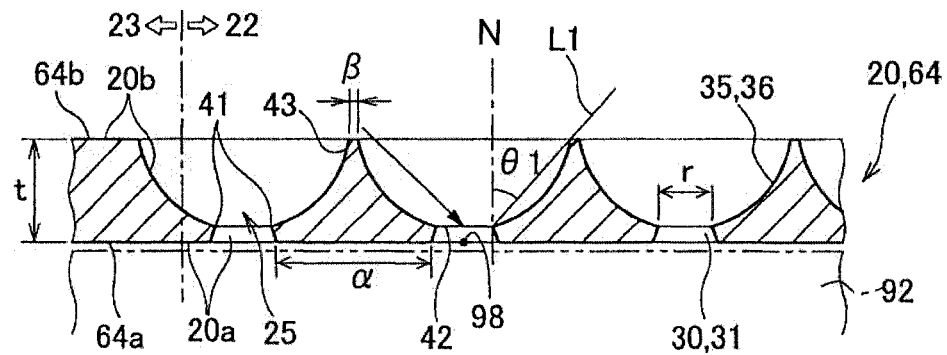
[FIG. 7]

The intermediate part 18 will be described in detail below. FIG. 6 is a plan view depicting, in an enlarged form, the intermediate part 18, and FIG. 7 is a sectional view, taken in direction VII-VII, of the intermediate part 18 of FIG. 6. As illustrated in FIG. 6, the plurality of through-holes 25 are regularly arranged at predetermined pitches respectively in two directions orthogonal to each other, in the effective regions 22.

The effective regions 22 will be described in detail below. FIG. 6 is a plan view depicting, in an enlarged form, the effective regions 22 as viewed from the second surface 20b of the vapor deposition mask 20. As depicted in FIG. 6, in the example illustrated, the plurality of through-holes 25 formed in each effective region 22 are arranged at predetermined pitches respectively in the two directions orthogonal to each other, in the effective regions 22.

FIG. 7 is a sectional view, taken along direction VII-VII, of the effective region 22 of FIG. 6. As depicted in FIG. 7, the plurality of through-holes 25 penetrate from the first surface 20a to the second surface 20b of the vapor deposition mask 20. In the example illustrated, as will be described in detail later, a first surface 64a of a metallic plate 64 that is on one side in the normal direction N of the first surface 20a of the vapor deposition mask 20 is formed with first recesses 30 by etching, and a second surface 64b of the metallic plate 64 that is on the other side in the normal direction N is formed with second recesses 35. The first recess 30 is connected to the second recess 35, whereby the second recess 35 and the first recess 30 are formed to communicate with each other. The through-hole 25 includes the second recess 35 and the first recess 30 connected to the second recess 35. As illustrated in FIGS. 6 and 7, a wall surface 31 of the first recess 30 and a wall surface of the second recess 35 are connected through a circumference-shaped connection section 41. The connection section 41 defines a penetration section 42 which is the smallest in opening area of the through-hole 25 in plan view of the vapor deposition mask 20.

As illustrated in FIG. 7, on the first surface 20a side of the vapor deposition mask 20, two adjacent through-holes 25 are spaced from each other along the first surface 64a of the metallic plate 64. On the second surface 20b side of the vapor deposition mask 20, also, two adjacent second recesses 35 may be spaced from each other along the second surface 64b of the metallic plate 64. In other words, the second surface 64b of the metallic plate 64 may be left between the two adjacent second recesses 35. In the following description, a part of the effective region 22 of the second surface 64b of the metallic plate 64, which is left without being etched, will be referred to also as a top part 43. By producing the vapor deposition mask 20 in such a manner that such top parts 43 are left, it is possible to provide the vapor deposition mask 20 with sufficient strength. By this, it is possible to restrain the vapor deposition mask 20 from being broken during transport, for example. Note that if the width p of the top part 43 is too large, shadow may be generated in a vapor deposition step, whereby utilization efficiency of the vapor deposition material 98 may be lowered. Therefore, it is preferable to produce the vapor deposition mask 20 in such a manner that the width p of the top part 43 will not be excessively large.

In a case where the vapor deposition mask device 10 is accommodated in the vapor deposition device 90 as depicted in FIG. 1A, the first surface 20a of the vapor deposition mask 20 faces the organic EL substrate 92, and the second surface 20b of the vapor deposition mask 20 is located on the side of the crucible 94 holding the vapor deposition material 98, as depicted by alternate long and two short dashes line in FIG. 7. Therefore, the vapor deposition material 98 is deposited on the organic EL substrate 92 by passing through the second recess 35 gradually decreasing in opening area. As depicted by an arrow extending from the second surface 20b side toward the first surface 20a in FIG. 7, the vapor deposition material 98 is not only moved along the normal direction N of the first surface 20a of the vapor deposition mask 20, but also may be moved in a direction largely inclined relative to the normal direction N, from the crucible 94 toward the organic EL substrate 92. In this instance, if the thickness of the vapor deposition mask 20 is large, the vapor deposition material 98 moved obliquely is liable to be caught on the top part 43, the wall surface 36 of the second recess 35 and the wall surface 31 of the first recess 30, resulting in that the proportion of the vapor deposition material 98 which cannot pass through the through-holes 25 is increased. Therefore, it is considered that for enhancing the utilization efficiency of the vapor deposition material 98, it is preferable to reduce the height of the wall surface 36 of the second recess 35 and the wall surface 31 of the first recess 30. In other words, it is preferable to use a metallic plate 64 having a thickness t as small as possible within such a range that strength of the vapor deposition mask 20 can be secured, as the metallic plate 64 for constituting the vapor deposition mask 20. Taking this into consideration, in the present embodiment, the thickness t of the vapor deposition mask 20 is, for example, equal to or less than 30 μm, preferably equal to or less than 25 μm, more preferably equal to or less than 20 μm. On the other hand, if the thickness of the vapor deposition mask 20 becomes too small, the strength of the vapor deposition mask 20 is lowered, and damaging or deformation of the vapor deposition mask 20 is liable to occur. Taking this into consideration, the thickness t of the vapor deposition mask 20 is preferably equal to or more than 5 μm. The thickness t of the vapor deposition mask 20 may be equal to or more than 8 μm, may be equal to or more than 10 μm, may be equal to or more than 12 μm, may be equal to or more than 13 μm, and may be equal to or more than 15 μm. The range of the thickness t of the vapor deposition mask 20 may be determined by a combination of an arbitrary one of the above-mentioned plurality of upper limit candidate values and an arbitrary one of the above-mentioned plurality of lower limit candidate values. For instance, the range of the thickness t of the vapor deposition mask 20 may be equal to or more than 5 μm to equal to or less than 30 μm, may be equal to or more than 8 μm to equal to or less than 25 μm, may be equal to or more than 10 μm to equal to or less than 20 μm, may be equal to or more than 13 μm to equal to or less than 20 μm, and may be equal to or more than 15 μm to equal to or less than to 20 μm. In addition, the range of the thickness t of the vapor deposition mask 20 may be determined by a combination of arbitrary two of the above-mentioned plurality of upper limit candidate values. For example, the range of the thickness t of the vapor deposition mask 20 may be equal to or more than 20 μm to equal to or less than 25 μm. Besides, the range of the thickness t of the vapor deposition mask 20 may be determined by a combination of arbitrary two of the above-mentioned plurality of lower limit candidate values. For example, the range of the thickness t of the vapor deposition mask 20 may be equal to or more than 13 μm to equal to or less than 15 μm. Note that the thickness t is the thickness of the peripheral region 23, that is, a part of the vapor deposition mask 20 at which the first recess 30 and the second recess 35 are not formed. Therefore, the thickness t can be said to be the thickness of the metallic plate 64.

In FIG. 7, a minimum angle that a straight line L1 passing through the connection section 41 as a part having a minimum opening area of the through-hole 25 and another arbitrary position of the wall surface 36 of the second recess 35 forms with the normal direction N of the first surface 20a of the vapor deposition mask 20 is denoted by symbol θ1. For causing the vapor deposition material 98 moved obliquely to reach the organic EL substrate 92 as much as possible without reaching the wall surface 36, it is advantageous to increase the angle θ1. For increasing the angle θ1, it is effective to reduce the width β of the aforementioned top part 43, in addition to a reduction in the thickness t of the vapor deposition mask 20.

In FIG. 7, symbol a denotes the width of a part of the effective region 22 of the first surface 64a of the metallic plate 64, which is left without being etched (this part will hereinafter be referred to also as a rib part). The width a of the rib part and the size r of the penetration section 42 are appropriately determined according to the size of the organic EL display device and the number of display pixels. For instance, the width a of the rib part is equal to or more than 5 pm to equal to or less than 40 μm, and the size r of the penetration section 42 is equal to or more than 10 μm to equal to or less than to 60 μm.

Note that an example in which the second surface 64b of the metallic plate 64 is left between two second recesses 35 adjacent to each other has been depicted in FIGS. 6 and 7, but this is not limitative. Though not illustrated, etching may be conducted in such a manner that the two second recesses 35 adjacent to each other are connected. In other words, a place where the second surface 64b of the metallic plate 64 is not left may be present between the two second recesses 35 adjacent to each other.

Frame

Next, the frame 15 will be described in detail below. As illustrated in FIGS. 1A and 2 to 5A, the frame 15 includes the front surface (or a third surface) 15a, a back surface (or a fourth surface) 15b opposite to the front surface 15a, and the outside surface (or a fifth surface) 15c extending between the front surface 15a and the back surface 15b. As depicted in FIG. 5A, the front surface 15a and the back surface 15b extend in parallel to each other in directions orthogonal to the normal direction N of the first surface 20a of the vapor deposition mask 20, as viewed in a section along the normal direction N. The outside surface 15c extends in the normal direction N of the first surface 20a of the vapor deposition mask 20, as viewed in a section along the normal direction N, and is orthogonally connected to the front surface 15a and the back surface 15b. Such a frame 15 is formed with the through-hole 15d extending from the front surface 15a to the back surface 15b. At the time of vapor deposition, the vapor deposition material 98 evaporated from the crucible 94 is deposited on the organic EL substrate 92 by passing through the through-hole 15d of the frame 15. Note that the outside surface (or the fifth surface) 15c may extend in a direction inclined relative to the normal direction N of the first surface 20a of the vapor deposition mask 20, as viewed in a section along the normal direction N.

Manufacturing Apparatus for Vapor Deposition Mask Device

Figure 8:
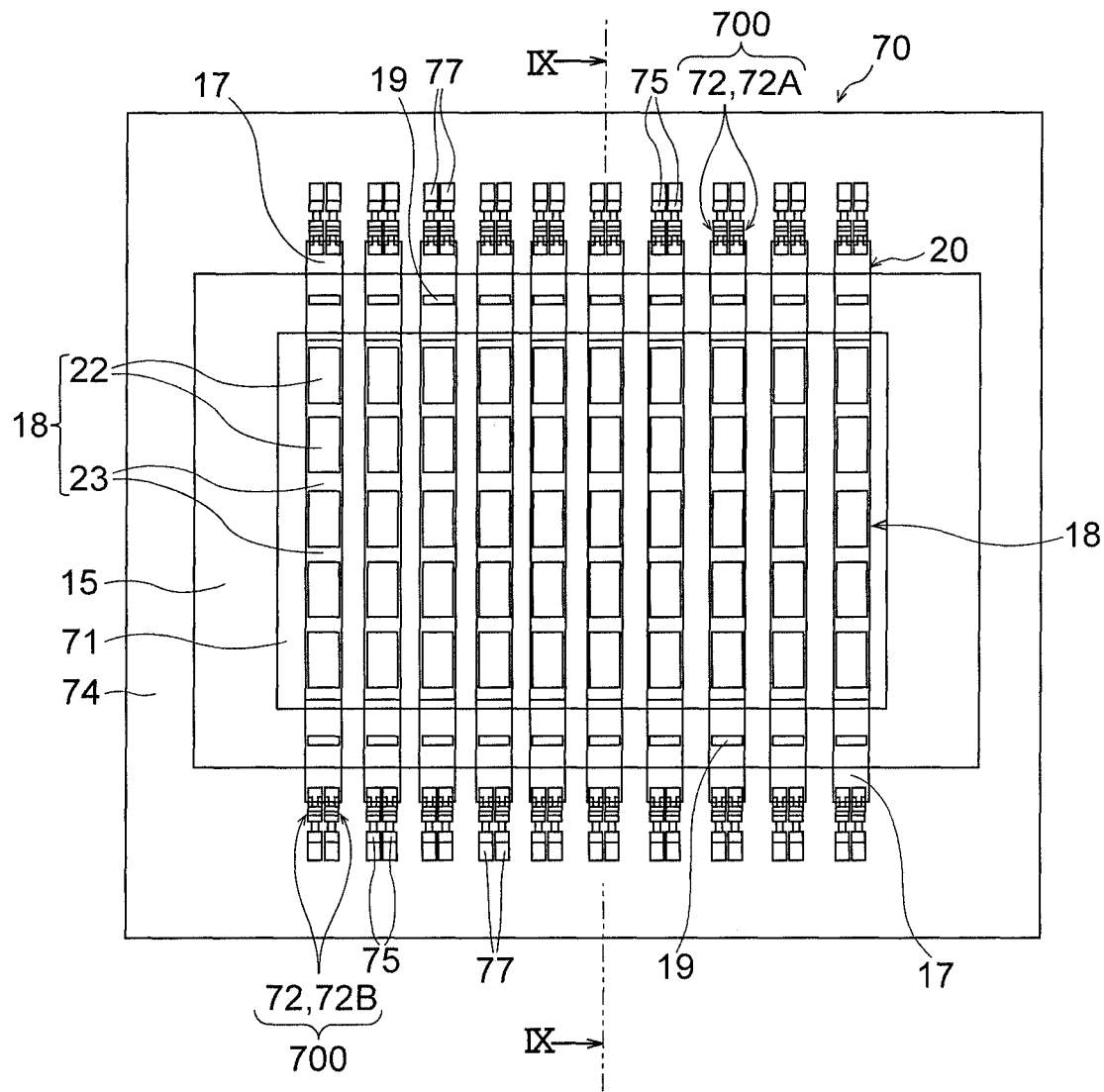
[FIG. 8]

A manufacturing apparatus 70 for the vapor deposition mask device 10 (hereinafter referred to as the manufacturing apparatus) will be described below. As illustrated in FIGS. 8 to 9B, the manufacturing apparatus 70 includes a stage 71 that is in close contact with the frame 15, and the jig 700 that supports the vapor deposition mask 20.

The stage 71, of these components, is configured to be movable in three-dimensional directions, is supported on a base through a driving section 73 rotatable around a predetermined rotational axis orthogonal to the normal direction N of the first surface 20a of the vapor deposition mask 20, and is configured to be movable at least in the normal direction N. In this instance, the moving range of the stage 71 may be set, for example, within the range of 30 μm or more to 90 μm or less. Note that driving the stage 71 is configured to be movable in horizontal directions (plane directions of the first surface 20a of the vapor deposition mask 20) orthogonal to the normal direction N, by driving the driving section 73, is configured, for example, in such a manner that the angle relative to a floor surface can be changed, and is configured in such a manner that the position of the vapor deposition mask 20 disposed on the frame 15 in a horizontal direction or the like can be controlled, as will be described later. In this case, the driving section 73 may move the stage 71 by use of, for example, an air cylinder, a hydraulic cylinder, a servo motor or the like.

The jig 700 supports the extension section 17b of the vapor deposition mask 20. The jig 700 according to the present embodiment is the clamp 72. The clamp 72 is configured to clamp the extension section 17b of the vapor deposition mask 20. The clamp 72 is supported on the base 74 through a support column 75 extending along the normal direction N of the first surface 20a of the vapor deposition mask 20. In the present embodiment, a plurality of the clamps 72 are provided. For example, the manufacturing apparatus 70 is configured such that one extension section 17b is clamped by two clamps 72. In this case, the two clamps 72 are disposed in parallel to each other. With one extension section 17b thus clamped by a plurality of clamps 72, tension can be applied substantially uniformly in plane directions of the vapor deposition mask 20. Note that the number of the clamps 72 for clamping one extension section 17b is arbitrary, and the number may be one, or may be three or more.

Such clamps 72 include a first clamp 72A, and a second clamp 72B located on the opposite side of the vapor deposition mask 20 from the first clamp 72A. In other words, the clamps 72 include the first clamp 72A that clamps the extension section 17b of one of the pair of ear parts 17 of the vapor deposition mask 20, and the second clamp 72B that clamps the extension section 17b of the other of the pair of ear parts 17. Note that in the following description, in a case of describing the configuration, function, operation or the like common for the first clamp 72A and the second clamp 72B, the first clamp 72A and the second clamp 72 will be generically referred to also as the clamp 72.

As depicted in FIG. 9B, each clamp 72 includes a fixed section 72a attached to the support column 75, and a movable section 72c rotatably mounted through a support section 72b attached to the fixed section 72a. Of these sections, the fixed section 72a is attached to the support column 75 through driving means 77 such as, for example, an air cylinder, a hydraulic cylinder, a servo motor or the like. Therefore, the clamp 72 is configured to be movable in the normal direction N of the first surface 20a of the vapor deposition mask 20 and in plane directions of the first surface 20a of the vapor deposition mask 20, by driving the driving means 77. In this case, the fixed section 72a and the movable section 72c of the clamp 72 are formed with surfaces 721a and 721c which are opposed to each other in a flat surface shape, as depicted in FIG. 9C.

Note that the shapes of the surface 721a of the fixed section 72a of the clamp 72 and the surface 721c of the movable section 72c are not particularly limited. For instance, as depicted in FIG. 9D, the surface 721a and the surface 721c may have rugged shapes, i.e., projected and recessed shapes. With the surface 721a and the surface 721c having the rugged shapes, tension can be effectively applied to the vapor deposition mask 20. In this instance, the height H1 and the height H2 (the difference between a most projected portion and a most recessed portion) of the rugged shapes may be, for example, equal to or more than 0.01 mm, may be equal to or more than 0.05 mm, may be equal to or more than 0.10 mm, may be equal to or more than 0.50 mm, and may be equal to or more than 1.00 mm. In addition, the height H1 and the height H2 of the rugged shapes may be equal to or less than 3.00 mm, may be equal to or less than 2.50 mm, and may be equal to or less than 2.00 mm. The height H1 and the height H2 of the rugged shapes may be determined by a combination of arbitrary one of the above-mentioned plurality of upper limit candidate values and arbitrary one of the above-mentioned plurality of lower limit candidate values. For example, the height H1 and the height H2 of the rugged shapes may be equal to or more than 0.01 mm to equal to or less than 3.00 mm, may be equal to or more than 0.05 mm to equal to or less than 2.50 mm, and may be equal to or more than 1.00 mm to equal to or less than 2.00 mm. In addition, the height H1 and the height H2 of the rugged shapes may be determined by a combination of arbitrary two of the above-mentioned plurality of upper limit candidate values. For instance, the height H1 and the height H2 of the rugged shapes may be equal to or more than 2.00 mm to equal to or less than 2.50 mm. Besides, the height H1 and the height H2 of the rugged shapes may be determined by a combination of arbitrary two of the above-mentioned plurality of lower limit candidate values. For example, the height H1 and the height H2 of the rugged shapes may be equal to or more than 0.01 mm to equal to or less than 0.50 mm. In addition, the surface 721a and the surface 721c may have different rugged shapes. With the height H1 and the height H2 of the rugged shapes being equal to or more than 0.01 mm, tension can be effectively applied to the vapor deposition mask 20. Besides, with the height H1 and the height H2 of the rugged shapes being equal to or less than 3.00 mm, it is possible to restrain that when the clamp 72 clamps the vapor deposition mask 20, a local force is exerted on a part of the vapor deposition mask 20, which is clamped by the clamp 72.

Such a clamp 72 is configured such that by rotating the movable section 72c, the extension section 17b of the vapor deposition mask 20 is clamped between the fixed section 72a and the movable section 72c, or the extension section 17b is released from between the fixed section 72a and the movable section 72c.

In addition, the jig 700 is configured such that in the state of supporting the vapor deposition mask 20, the second surface 20b of the weld section 17a is in close contact with the front surface 15a of the frame 15, and the second surface 20b of the extension section 17b is at least partly located toward the back surface 15b of the frame 15 rather than the front surface 15a of the frame 15. In other words, the vapor deposition mask 20 is configured such that at least part of the second surface 20b of the vapor deposition mask 20 is in close contact with the front surface (or the third surface) 15a of the frame 15, and, when viewed from the normal direction N of the first surface 20a of the vapor deposition mask 20, at least part of the second surface 20b of a part of the vapor deposition mask 20, which does not overlap with the frame 15, is located toward the back surface (or the fourth surface) 15b rather than the front surface (or the third surface) 15a. In the present embodiment, the clamp 72 clamps the extension section 17b of the vapor deposition mask 20, and, in a state in which the clamp 72 clamps the vapor deposition mask 20, the second surface 20b of the weld section 17a is in close contact with the front surface 15a of the frame 15, and the second surface 20b of the extension section 17b is at least partly located toward the back surface 15b of the frame 15 rather than the front surface 15a of the frame 15. In this way, the jig 700 (in the present embodiment, the clamp 72) tensions the vapor deposition mask 20 in the plane directions of the vapor deposition mask 20 in such a manner that flexure or a wavy shape would not be generated in the vapor deposition mask 20 disposed on the front surface 15a of the frame 15. Here, the term "to tension" herein means to apply a tension. For instance, to tension the vapor deposition mask in the plane directions of the vapor deposition mask 20 means to apply tensions to the vapor deposition mask 20 along the plane directions of the vapor deposition mask 20.

Figure 9A:
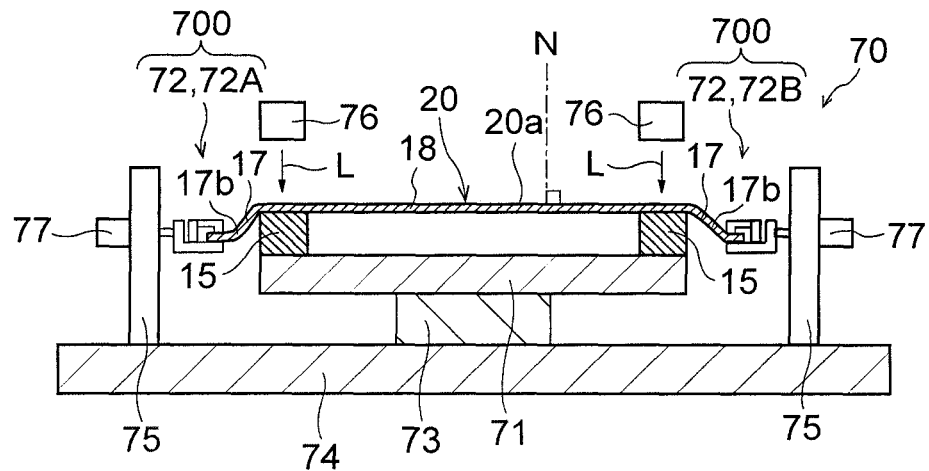
[FIG. 9A]
Figure 9B:
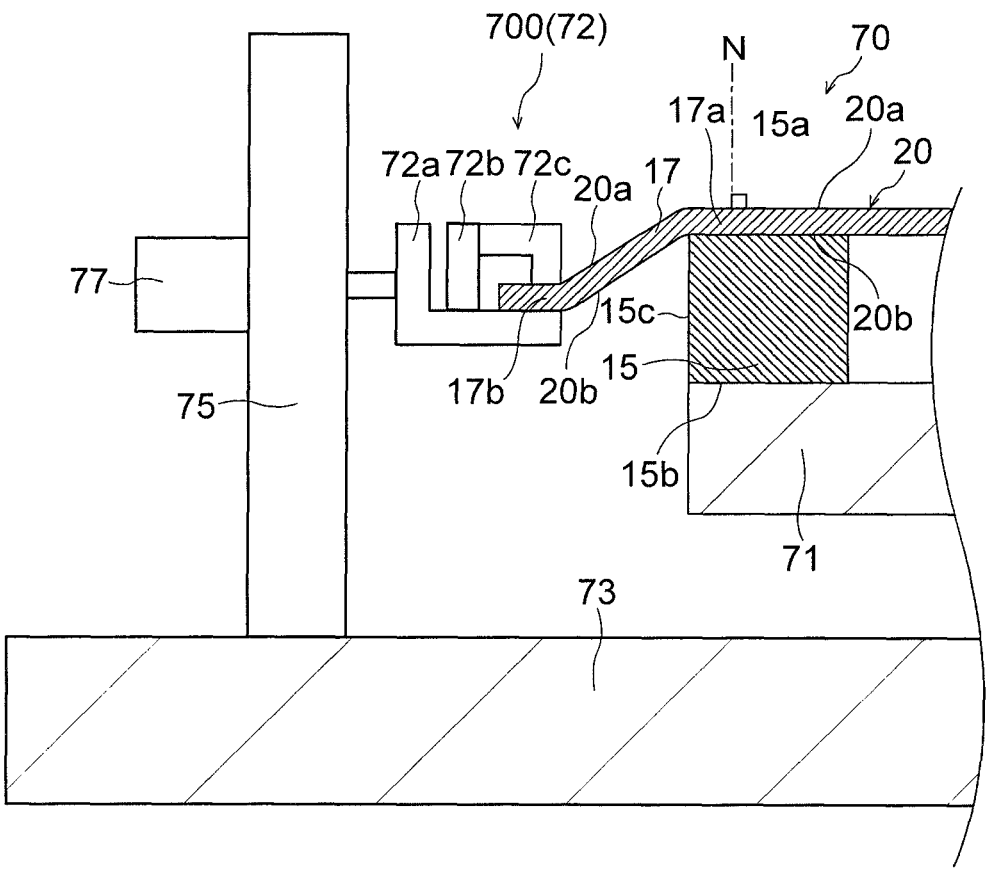
[FIG. 9B]
Figure 9C:
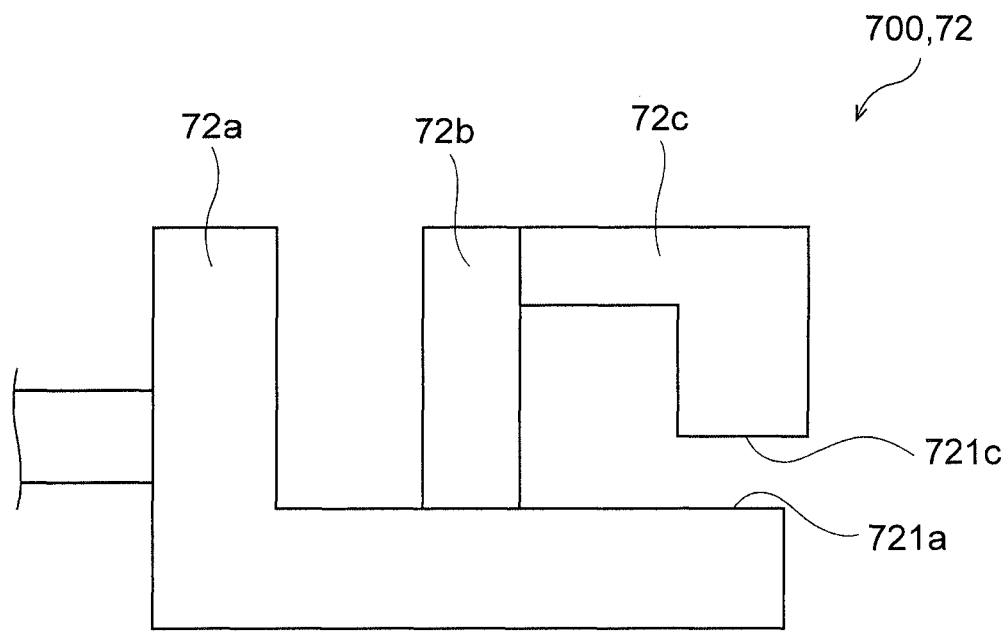
[FIG. 9C]
Figure 9D:
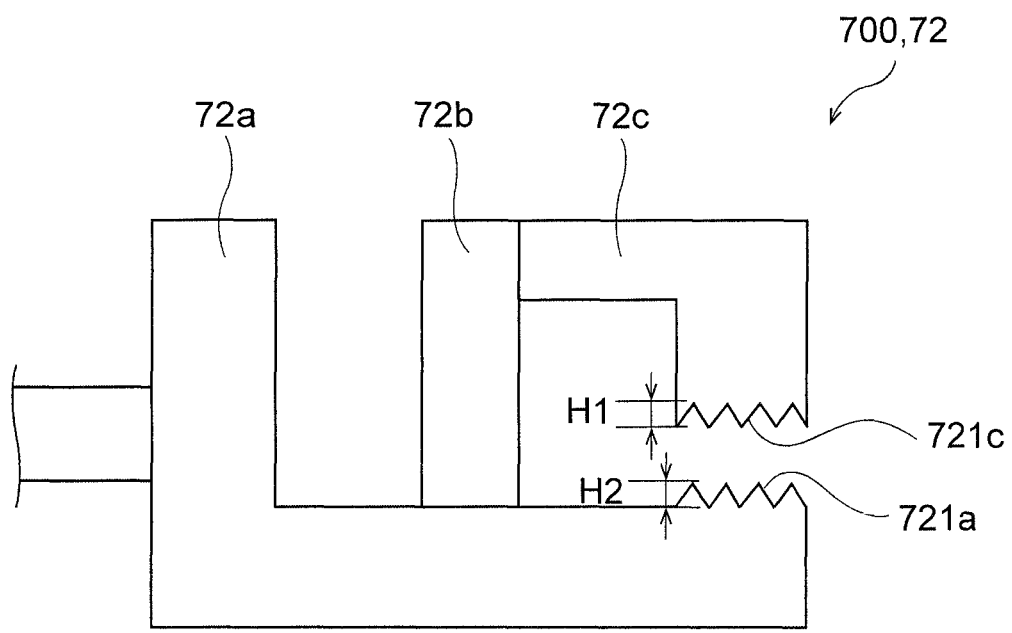
[FIG. 9D]

Besides, as illustrated in FIG. 9A, the manufacturing apparatus 70 further includes a welding device 76 to join the weld section 17a of the vapor deposition mask 20 to the frame 15. The welding device 76 may be, for example, a laser device which applies laser light L. In this case, as the laser light, there can be used, for example, YAG laser light (wavelength 355 nm, 532 nm, 1064 nm) generated by a YAG laser device. As the YAG laser device, there can be used, for example, one in which a crystal of YAG (yttrium aluminum garnet) with Nd (neodymium) added thereto is provided as an oscillation medium.

A method of manufacturing the vapor deposition mask device 10 will be described below. First, a method of manufacturing the vapor deposition mask 20 of the vapor deposition mask device 10 will be described.

Manufacturing Method for Vapor Deposition Mask

Manufacturing Method for Metallic Plate

First, a manufacturing method for the metallic plate to be used for manufacturing the vapor deposition mask will be described.

Melting Step

First, iron and nickel and other raw materials are prepared. For instance, the raw materials are prepared in such a manner that the proportion of iron and the proportion of nickel based on the whole part of the raw materials are approximately 64% by weight and approximately 36% by weight, respectively. Subsequently, the raw materials are crushed, as required, after which a melting step of melting the raw materials in a melting furnace is conducted. For example, by utilizing gas discharge such as arc discharge, the raw materials are melted and mixed. By this, a base material for the metallic plate can be obtained.

The temperature at the time of melting is set according to the raw materials, and is, for example, equal to or higher than 1,500° C. The melting step may include a step of throwing in aluminum, manganese, silicon and the like into the melting furnace for the purpose of deacidification, dehydration, denitrification and the like. Besides, the melting step may be carried out at a low pressure state of lower than the atmospheric pressure, in an atmosphere of an inert gas such as argon gas.

Grinding Step

After the base material is taken out of the melting furnace, a grinding step of shaving off a surface of the base material is performed. By this, a film of an oxide such as scale can be removed. In this instance, the specific grinding method is not particularly limited; a so-called grinding method of grinding the surface of the base material by rotating a grinding wheel, a so-called pushing-in method of pushing the base material to a cutting tool to shave off the surface of the base material, and the like can be adopted. The grinding step may be carried out in such a manner that the thickness of the base material will be uniform.

Rolling Step

Figure 10:
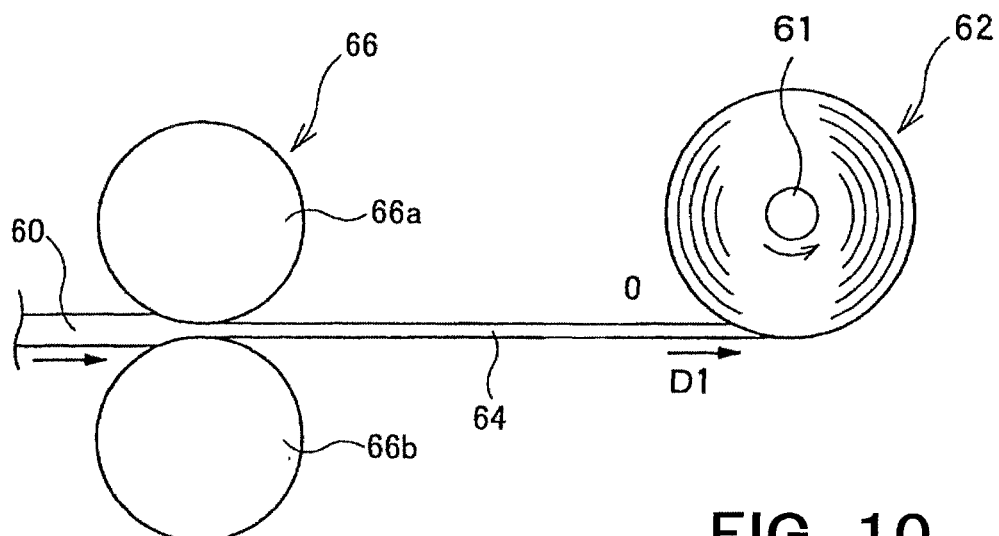
[FIG. 10]

Subsequently, as depicted in FIG. 10, a rolling step is conducted in which the base material 60 including a nickel-containing iron alloy is rolled. For example, the base material 60 is conveyed along a direction indicated by arrow D1 toward a rolling device 66 including a pair of rolling rolls (work rolls) 66a and 66b. The base material 60 reaching a position between the pair of rolling rolls 66a and 66b is rolled by the pair of rolling rolls 66a and 66b, resulting in that the thickness of the base material 60 is reduced and the base material 60 is extended along the conveying direction. By this, a metallic plate 64 having a predetermined thickness can be obtained. As illustrated in FIG. 10, the metallic plate 64 may be taken up around a core 61, to form a roll 62.

Note that FIG. 10 merely depicts an outline of the rolling step, and the specific configuration and procedure for carrying out the rolling step are not particularly limited. For example, the rolling step may include a hot rolling step in which the base material is processed at a temperature of equal to or higher than a temperature for changing the crystal arrangement of the iron alloy constituting the base material 60, and a cold rolling step in which the base material is processed at a temperature of equal to or lower than the temperature for changing the crystal arrangement of the iron alloy. In addition, the direction in which the base material 60 and the metallic plate 64 are passed between the pair of rolling rolls 66a and 66b is not limited to one direction. For example, in FIG. 10, the base material 60 and the metallic plate 64 may be repeatedly passed between the pair of rolling rolls 66a and 66b in a direction from the left side toward the right side of the paper surface and in a direction from the right side toward the left side of the paper surface, to thereby gradually roll the base material 60 and the metallic plate 64.

Besides, in the cold rolling step, a coolant such as kerosene may be supplied between the base material 60 and the rolling rolls 66a and 66b. By this, the temperature of the base material can be controlled.

Annealing Step

Figure 11:
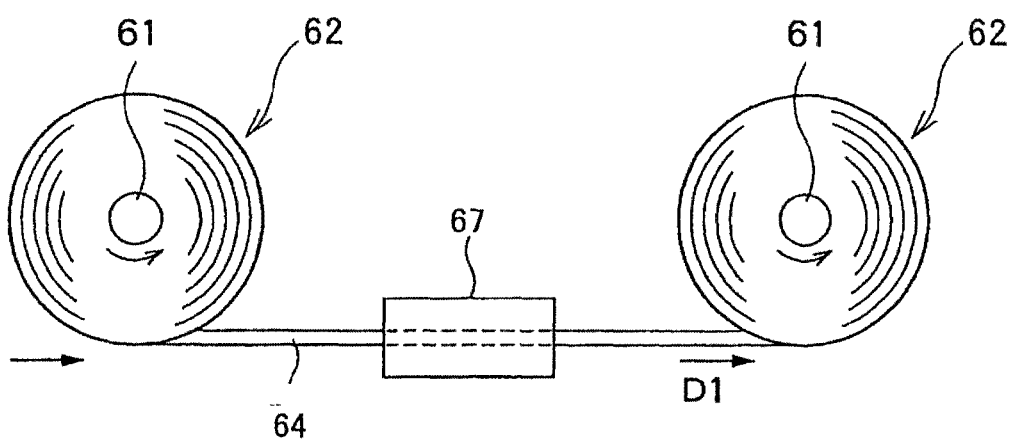
[FIG. 11]

Thereafter, for removing residual stress accumulated in the metallic plate 64 due to the rolling, the metallic plate 64 may be annealed using an annealing device 67, as depicted in FIG. 11. As illustrated in FIG. 11, the annealing step may be performed while pulling the metallic plate 64 in the conveying direction (longitudinal direction). In other words, the annealing step may be carried out not as so-called batch type annealing but as continuous annealing conducted with conveyance. In this case, temperature and conveying speed are preferably set in such a manner as to restrain deformation such as buckling from being generated in the metallic plate 64. By carrying out the annealing step, the metallic plate 64 in which the residual strain has been removed to some extent can be obtained.

Slitting Step

Thereafter, a slitting step may be performed in which both ends in the width direction of the metallic plate 64 obtained by the rolling step are cut off by predetermined ranges in such a manner that the width of the metallic plate 64 will be within a predetermined range. This slitting step is carried out for removing cracks which may possibly be generated at both ends of the metallic plate 64 due to the rolling. With such a slitting step conducted, a phenomenon in which the metallic plate 64 is broken, or so-called plate breaking, can be prevented from occurring with a crack as a starting point. In addition, this slitting step may be performed before the aforementioned annealing step.

Note that at least two of the aforementioned rolling step, annealing step and slitting step may be repeated multiple times, to thereby produce a long metallic plate 64 having a predetermined thickness. In addition, while an example in which the annealing step is conducted while pulling the metallic plate 64 in the longitudinal direction has been illustrated in FIG. 11, this is not limitative; the annealing step may be carried out in a state in which the metallic plate 64 has been taken up around the core 61. In other words, batch-type annealing may be performed. Note that in a case where the annealing step is conducted in a state in which the metallic plate 64 has been taken up around the core 61, a warp according to the take-up diameter of the roll 62 may be generated in the metallic plate 64. Therefore, depending on the roll diameter of the roll 62 and the material constituting the base material 60, it is advantageous to carry out the annealing step while pulling the metallic plate 64 in the longitudinal direction.

External Appearance Inspection Step

In addition, after the rolling step, or after the annealing step, an external appearance inspection step of inspecting the external appearance of the metallic plate 64 may be conducted. The external appearance inspection step may include a step of inspecting the external appearance of the metallic plate 64 by use of au automatic inspection device. Besides, the external appearance inspection step may include a step of inspecting the external appearance of the metallic plate 64 by visual inspection.

Shape Inspection Step

In addition, after the rolling step, or after the annealing step, a shape inspection step of inspecting the shape of the metallic plate 64 may be performed. For example, by use of a three-dimensional measuring instrument, the position of the surface of the metallic plate 64 in the thickness direction may be measured in a predetermined region of the metallic plate 64.

Manufacturing Method for Vapor Deposition Mask

Figure 12:
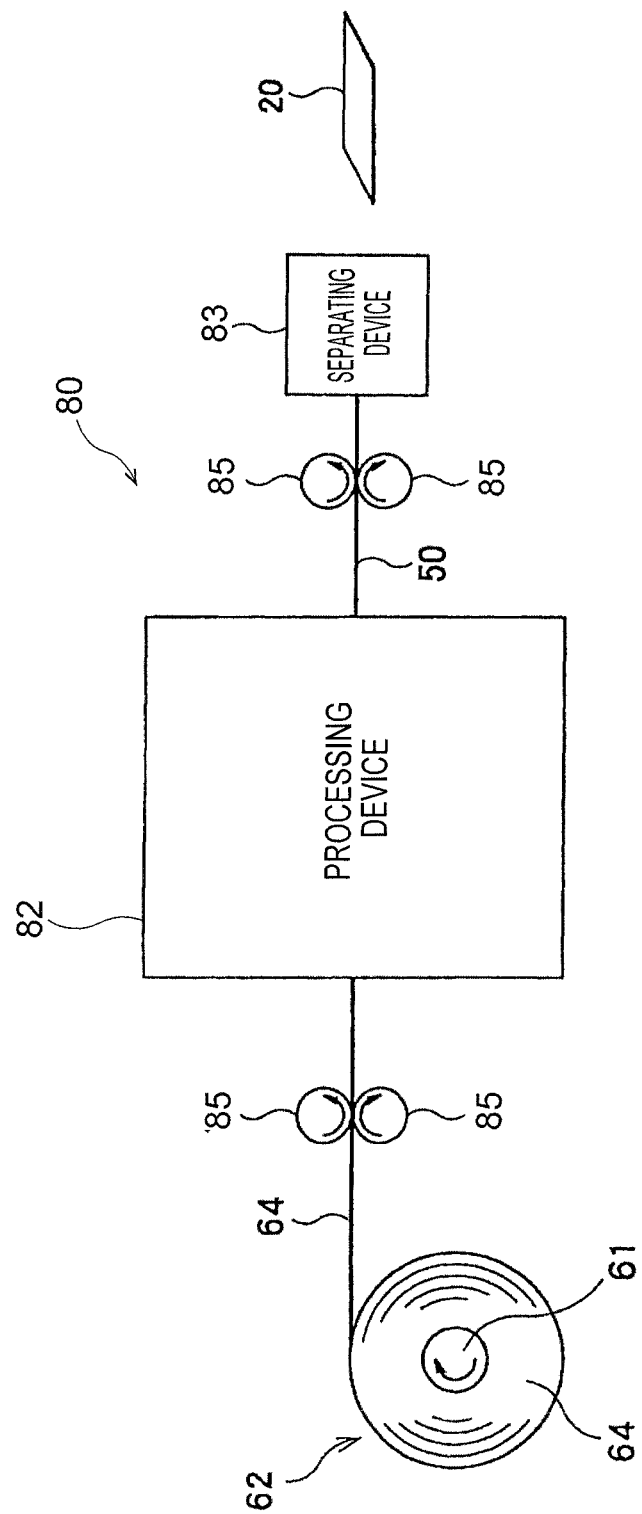
[FIG. 12]

A method of manufacturing the vapor deposition mask 20 by use of the metallic plate 64 obtained by the aforementioned steps will be described below, referring mainly to FIGS. 12 to 16. FIG. 12 is a diagram depicting a treatment device 80 for manufacturing the vapor deposition mask 20 by use of the metallic plate 64. First, the roll 62 obtained by taking up the metallic plate 64 around the core 61 is prepared. Then, the roll 62 is let off by rotating the core 61, whereby the metallic plate 64 extending in a belt form is supplied, as depicted in FIG. 12.

The metallic plate 64 supplied is conveyed sequentially to a processing device 82 and a separating device 83 by conveying rollers 85. The processing device 82 carries out a processing step of processing the metallic plate 64 to form through-holes in the metallic plate 64. Note that in the present embodiment, a multiplicity of through-holes 25 corresponding to the plurality of sheets of vapor deposition masks 20 are formed in the metallic plate 64. In other words, a plurality of sheets of vapor deposition masks 20 are allocated to the metallic plate 64. The separating device 83 performs a separating step in which a part of the metallic plate 64, which is formed with the plurality of through-holes 25 and corresponds to one sheet of vapor deposition mask 20, is separated from the metallic plate 64. In this way, sheet-shaped vapor deposition masks 20 can be obtained.

Processing Step

Figure 13:
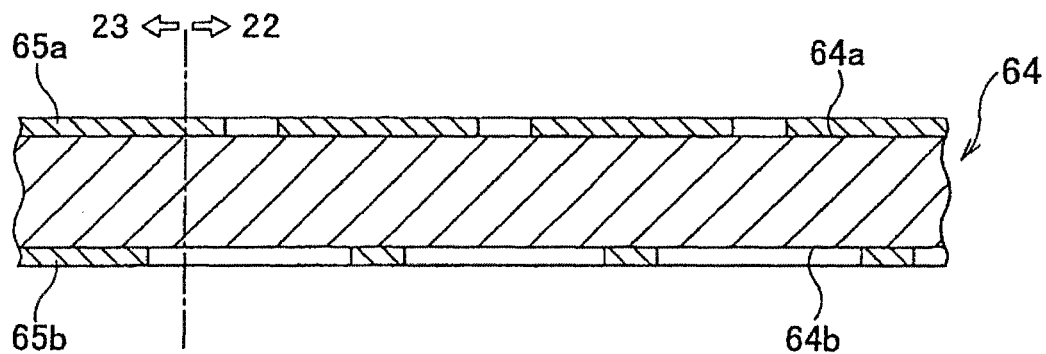
[FIG. 13]

Referring to FIGS. 13 to 16, the processing step will be described. First, a resist film including a photosensitive resist material is formed on the first surface 64a and the second surface 64b of the metallic plate 64. For example, a coating liquid containing a photosensitive resist material such as casein is applied to the metallic plate 64, followed by drying the coating liquid, to form the resist film. Alternatively, the metallic plate 64 may be adhered to a dry film, to form the resist film. Subsequently, the resist films are exposed and developed. By this, as illustrated in FIG. 13, a first resist pattern 65a can be formed on the first surface 64a of the metallic plate 64, and a second resist pattern 65b can be formed on the second surface 64b of the metallic plate 64.

Figure 14:
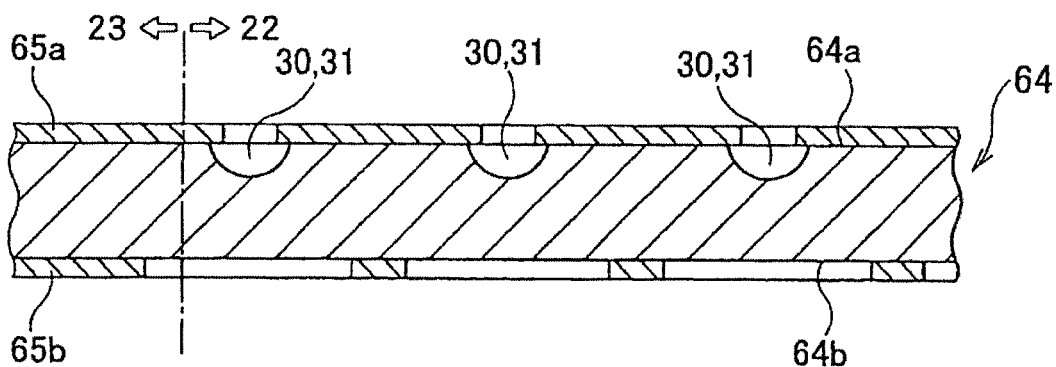
[FIG. 14]

Next, a first surface etching step is performed in which, as depicted in FIG. 14, those regions of the first surface 64a of the metallic plate 64 which are not covered with the first resist pattern 65a are etched by use of a first etching liquid. For example, the first etching liquid is jetted from a nozzle disposed in such a way as to face the first surface 64a of the metallic plate 64 conveyed toward the first surface 64a of the metallic plate 64 across the first resist pattern 65. As a result, as illustrated in FIG. 14, in those regions of the metallic plate 64 which are not covered with the first resist pattern 65a, erosion by the first etching liquid proceeds. By this, a multiplicity of first recesses 30 are formed in the first surface 64a of the metallic plate 64. As the first etching liquid, there is used, for example, a liquid containing a ferric chloride solution and hydrochloric acid.

Figure 15:
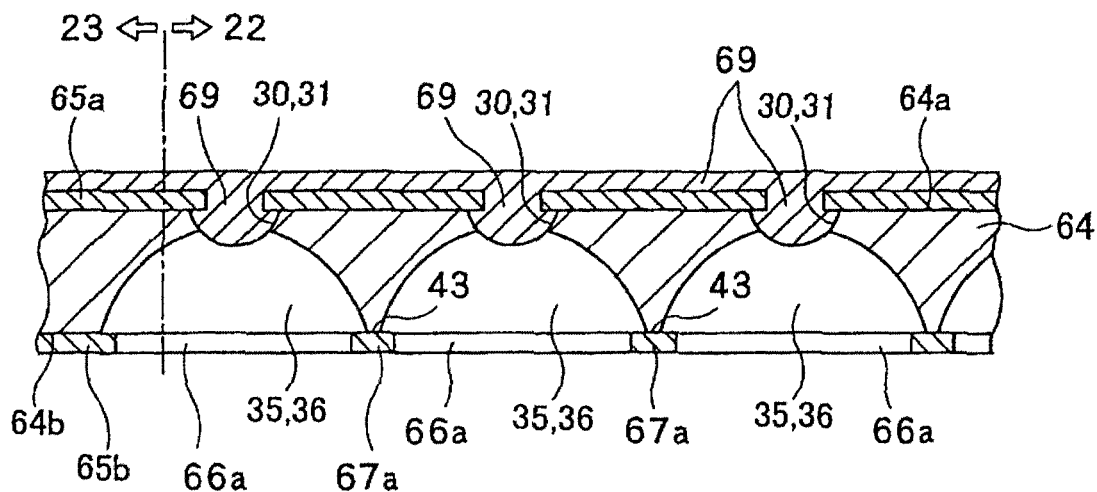
[FIG. 15]

Next, as depicted in FIG. 15, a second surface etching step is conducted in which those regions of the second surface 64b of the metallic plate 64 which are not covered with the second resist pattern 65b are etched, to form second recesses 35 in the second surface 64b. The second surface etching step is performed until the first recesses 30 and the second recesses 35 communicate with each other, to form the through-holes 25. As the second etching liquid, there is used, for example, a liquid containing a ferric chloride solution and hydrochloric acid, like the aforementioned first etching liquid. Note that at the time of the second surface etching step, the first recesses 30 may be coated with a resin 69 resistant to the second etching liquid, as illustrated in FIG. 15.

Figure 16:
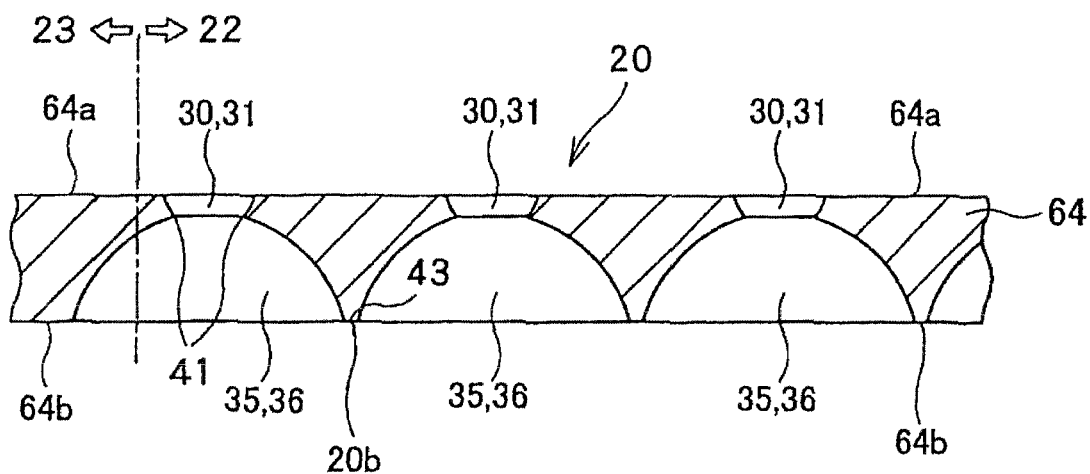
[FIG. 16]

Thereafter, as depicted in FIG. 16, the resin 69 is removed from the metallic plate 64. The resin 69 can be removed, for example, by use of an alkaline stripping solution. In a case where an alkaline stripping solution is used, the resist patterns 65a and 65b are also removed together with the resin 69, as depicted in FIG. 16. Note that after the resin 69 is removed, the resist patterns 65a and 65b may be removed separately from the resin 69, by use of a stripping solution different from the stripping solution for stripping the resin 69.

Separating Step

Thereafter, a part of the metallic plate 64, which is formed with the plurality of through-holes 25 and corresponds to one sheet of vapor deposition mask 20, is separated from the metallic plate 64, whereby the vapor deposition mask 20 can be obtained.

Vapor Deposition Mask Inspection Step

Note that after the aforementioned separating step, a vapor deposition mask inspection step of inspecting the vapor deposition mask 20 may be performed. In the vapor deposition mask inspection step, for example, it may be inspected whether or not deformed parts such as local projections or recesses are present in the surface of the metallic plate 64 constituting the vapor deposition mask 20.

Welding Step for Vapor Deposition Mask

Next, a welding step is conducted in which the vapor deposition mask 20 obtained as aforementioned is welded to the frame 15. By this, the vapor deposition mask device 10 which includes the vapor deposition mask 20 and the frame 15 can be obtained.

Incidentally, as a result of extensive and intensive researches conducted by the present inventors, it was found out that since a vapor deposition mask 20 having a small thickness is lower in rigidity than a vapor deposition mask 20 having a large thickness, flexure or a wavy shape tends to be generated when the vapor deposition mask 20 is disposed in a tensioned state on the frame 15. In addition, it was also found out that in this case, a gap is generated between the vapor deposition mask 20 and the frame 15, and the weld strength of the joint 19 is lowered. A phenomenon observed in a case where a vapor deposition mask 20 having a small thickness is welded to the frame 15 will be described referring to FIGS. 17A and 17B.

Figure 17A:
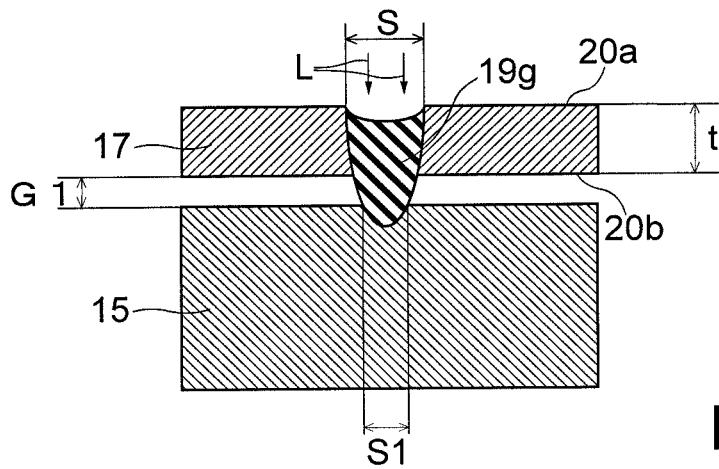
[FIG. 17A]
Figure 17B:
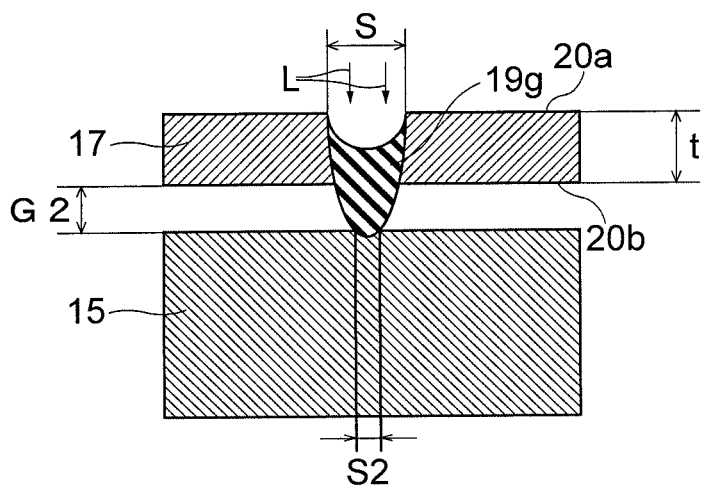
[FIG. 17B]

First, in a case of a vapor deposition mask 20 having a small thickness, the volume of a molten material 19g substantially defined by the thickness t of the vapor deposition mask 20 and the spot diameter S of laser light L is small. Therefore, the volume of a part of the molten material 19g, which mixes with the material of the frame 15, is small. Besides, in a state in which a gap G1 or a gap G2 is present between the vapor deposition mask 20 and the frame 15 as depicted in FIGS. 17A and 17B, in a case where the laser light L is applied to the vapor deposition mask 20, the molten material 19g droops toward the frame 15 due to gravity. Here, the gap G2 between the vapor deposition mask 20 and the frame 15 in FIG. 17B is wider than the gap G1 between the vapor deposition mask 20 and the frame 15 in FIG. 17A, and the diameter S2 of the part where the molten material 19g is in close contact with the frame 15 in FIG. 17B is smaller than the diameter S1 of the part where the molten material 19g is in close contact with the frame 15 in FIG. 17B. In this way, as the gap between the vapor deposition mask 20 and the frame 15 is wider, the area where the molten material 19g is in close contact with the frame 15 is smaller. In a case where the area of contact of the molten material 19g with the frame 15 is reduced, it becomes difficult for the heat obtained by heating by the laser light L to be transmitted to the frame 15. It is considered, therefore, that the volume in which the material of the frame 15 is melted is reduced, and the weld strength at the joint 19 is lowered. Note that the reason why the weld strength of the joint 19 is lowered is not limited to the aforementioned.

Figure 17C:
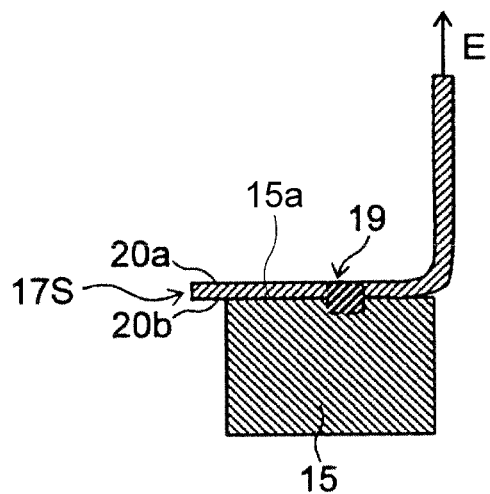
[FIG. 17C]

Note that the weld strength is a force required for peeling the ear part 17 of the vapor deposition mask 20 welded to the frame 15 by the joint 19 from the frame 15. FIG. 17C depicts one example of a method for measuring the weld strength of the joint 19. In a weld strength measuring step, first, a sample 17S obtained by cutting out part of the ear part 17 of the vapor deposition mask 20 is welded to the frame 15. Next, as depicted in FIG. 17C, a pulling force E in a direction along the normal direction of the front surface 15a of the frame 15 (in the vertical direction in FIG. 17C) is applied to end portions in the longitudinal direction of the sample 17S. In this case, the pulling force E at the time when the sample 17S is ruptured or the sample 17S is peeled off from the frame 15 is the weld strength of the joint 19.

Welding Step by the Present Embodiment

In order to solve the aforementioned problem in the conventional welding step, the present embodiment proposes to carry out the welding step by utilizing the manufacturing apparatus 70 for the vapor deposition mask device 10 that clamps the extension section 17b of the vapor deposition mask 20. The welding step according to the present embodiment will be described below, referring to FIGS. 18A to 19B.

Figure 18A:
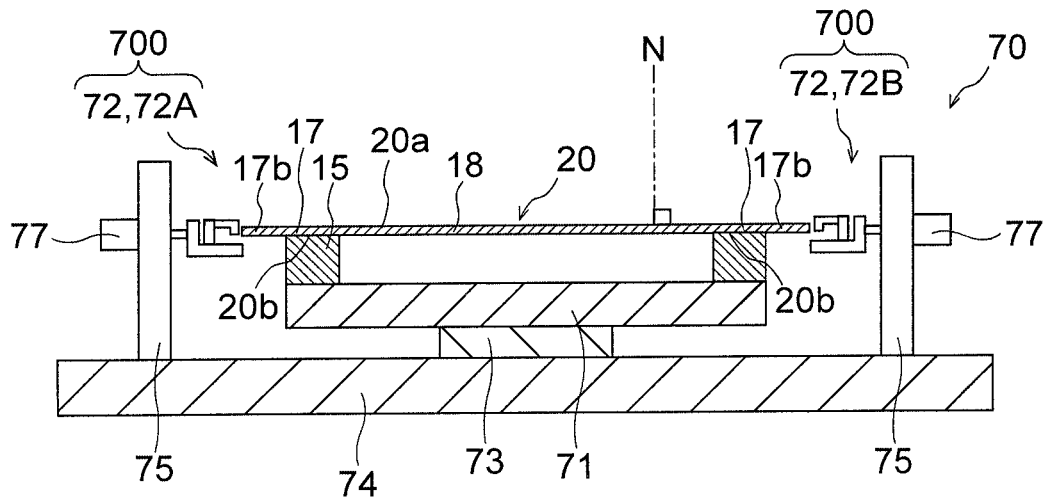
[FIG. 18A]
Figure 18B:
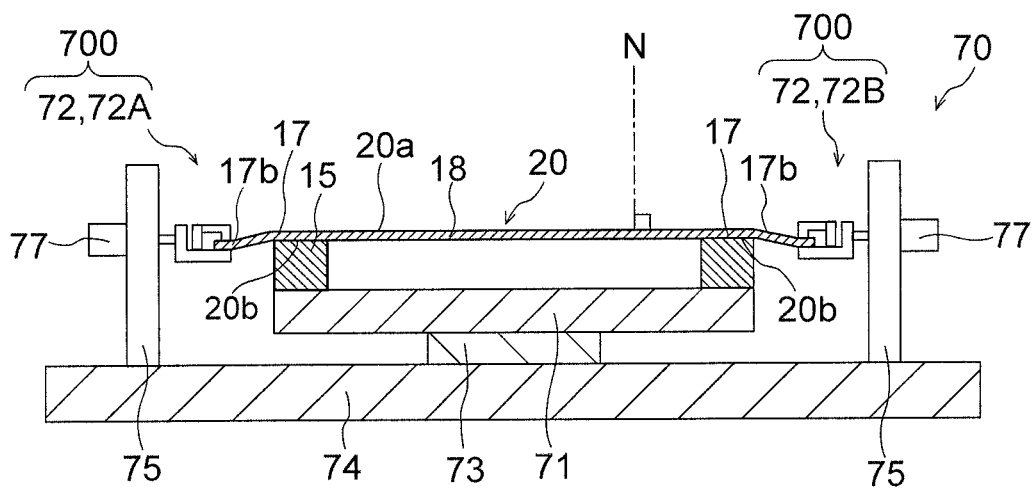
[FIG. 18B]

First, as illustrated in FIG. 18A, the ear part 17 of the vapor deposition mask 20 is disposed on the frame 15 in such a manner that the second surface 20b faces the frame 15. Next, as depicted in FIG. 18B, the vapor deposition mask 20 is supported by the jig 700. In the present embodiment, the extension sections 17b of the vapor deposition mask 20 are clamped by the clamps 72. In this case, the first clamp 72A of the clamps 72 clamps the extension section 17b of one of the pair of ear parts 17, and the second clamp 72B clamps the extension section 17b of the other of the pair of ear parts 17. In this instance, for example, the first clamp 72A and the second clamp 72B may simultaneously clamp the extension sections 17b of the ear parts 17. In addition, the second clamp 72B may clamp the extension section 17b of the other ear part after the first clamp 72A clamps the extension section 17b of the one ear part, or the first clamp 72A may clamp the extension section 17b of the one ear part after the second clamp 72B clamps the extension section 17b of the other ear part. Note that in this instance, the positions of the clamps 72 may be preliminarily controlled in such a manner that in a state in which the clamps 72 clamp the extension sections 17b, the second surface 20b of the extension section 17b is located toward the back surface 15b of the frame 15 rather than the front surface 15a of the frame 15. Besides, the ear parts 17 may be disposed on the frame 15 after the extension sections 17b of the vapor deposition mask 20 are clamped by the clamps 72.

Next, positioning of the vapor deposition mask 20 by the manufacturing apparatus 70 is conducted. In this case, a glass scale (not illustrated) formed with an alignment mark is prepared, and the clamp 72 is moved in horizontal directions (plane directions of the first surface 20a) orthogonal to the normal direction N of the first surface 20a of the vapor deposition mask 20 in such a manner that the vapor deposition mask 20 is positioned at a predetermined position, based on the alignment mark. In this way, tentative positioning of the vapor deposition mask 20 is conducted, and the vapor deposition mask 20 is held in a tensioned state. Subsequently, the driving section 73 is driven, and the position of the stage 71 and, for example, the angle relative to a floor surface are controlled, whereby positioning of the vapor deposition mask 20 is performed based on the alignment mark of the glass scale. In this instance, the clamps 72 may be independently driven to thereby control the position of the vapor deposition mask 20, or the clamps 72 may be simultaneously driven to thereby control the position of the vapor deposition mask 20. Note that the positioning of the vapor deposition mask 20 by the manufacturing apparatus 70 may be performed without using the glass scale. In this case, the positioning of the vapor deposition mask 20 maybe conducted using arbitrary positioning means; for example, design coordinates may be read into the manufacturing apparatus 70, and the position of the vapor deposition mask 20 may be controlled such as to reach the design coordinates. Further, in a case of performing the positioning of the vapor deposition mask 20 by the manufacturing apparatus 70, the stage 71 of the manufacturing apparatus 70 may be moved in the normal direction N and a plane direction of the first surface 20a together with the jig 700.

Figure 19A:
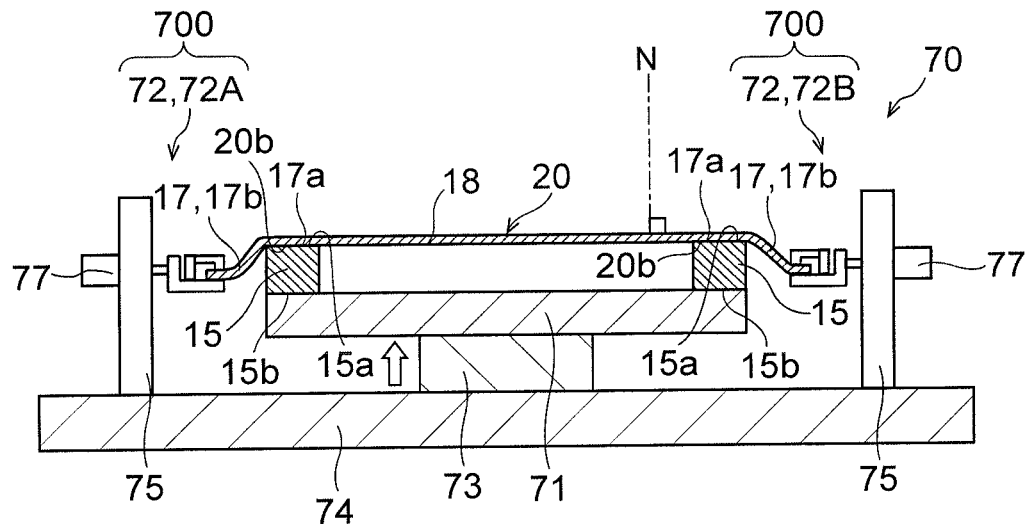
[FIG. 19A]

Subsequently, as illustrated in FIG. 19A, a tension is applied to the vapor deposition mask 20, in a state in which at least part of the second surface 20b of the vapor deposition mask 20 is in close contact with the front surface (or the third surface) 15a of the frame 15, and, when viewed from the normal direction N of the first surface 20a, at least part of the second surface 20b, of the vapor deposition mask 20, of the part which does not overlap with the frame 15 is located toward the back surface (or the fourth surface) 15b of the frame 15 rather than the front surface 15a of the frame 15. In other word, a tension is applied to the vapor deposition mask 20 in such a manner that the second surface 20b of the weld section 17a is in close contact with the front surface 15a of the frame 15 and the second surface 20b of the extension section 17b is at least partly located toward the back surface 15b (the lower side in FIG. 19A) of the frame 15 rather than the front surface 15a of the frame 15. In this instance, for example, the frame 15 is moved in the normal direction N of the first surface 20a of the vapor deposition mask 20, specifically, in a direction from the second surface 20b toward the first surface 20a. In this case, by driving the driving section 73, the stage 71 of the manufacturing apparatus 70 is raised, and the frame 15 is moved. In this instance, the upward moving distance of the stage 71 may be, for example, equal to or more than 0.001 mm, or may be equal to or more than 0.01 mm, or may be equal to or more than 0.03 mm. In addition, the upward moving distance of the stage 71 may be equal to or less than 2.00 mm, or may be equal to or less than 1.50 mm, or may be equal to or less than 1.20 mm. The upward moving distance of the stage 71 may be determined by a combination of an arbitrary one of the aforementioned plurality of upper limit candidate values and an arbitrary one of the aforementioned plurality of lower limit candidate values. For example, the upward moving distance of the stage 71 may be equal to or more than 0.001 mm to equal to or less than 2.00 mm, or may be equal to or more than 0.01 mm to equal to or less than 1.50 mm, or may be equal to or more than 0.03 mm to equal to or less than 1.20 mm. In addition, the upward moving distance of the stage 71 maybe determined by a combination of arbitrary two of the aforementioned plurality of upper limit candidate values. For instance, the upward moving distance of the stage 71 may be equal to or more than 1.20 mm to equal to or less than 1.50 mm. Besides, the upward moving distance of the stage 71 may be determined by a combination of arbitrary two of the aforementioned plurality of lower limit candidate values. For instance, the upward moving distance of the stage 71 may be equal to or more than 0.01 mm to equal to or less than 0.03 mm.

Incidentally, in the present embodiment, in a state in which the jig 700 (here, the clamps 72) clamps the vapor deposition mask 20, the second surface 20b of the weld section 17a is in close contact with the front surface 15a of the frame 15, and the second surface 20b of the extension section 17b is at least partly located toward the back surface 15b of the frame 15 rather than the front surface 15a of the frame 15. By this, the vapor deposition mask 20 can be pulled toward the back surface 15b of the frame 15 (toward the lower side in FIG. 19A) rather than the front surface 15a of the frame 15. Besides, in this instance, the tension is applied to those parts of the extension sections 17b which extend to the outer sides than the outside surfaces 15c of the frame 15, and the parts are pulled toward the back surface 15b of the frame 15. Therefore, the vapor deposition mask 20 is, as a whole, pressed toward the back surface 15b of the frame 15, so that the adhesion between the weld section 17a of the intermediate part 18 of the vapor deposition mask 20 and the frame 15 can be enhanced. For this reason, the vapor deposition mask 20 can be effectively tensioned in a plane direction thereof, and the adhesion between the vapor deposition mask 20 and the frame 15 can be enhanced. As a result, generation of flexure or a wavy shape in the vapor deposition mask 20 can be restrained.

Figure 19B:
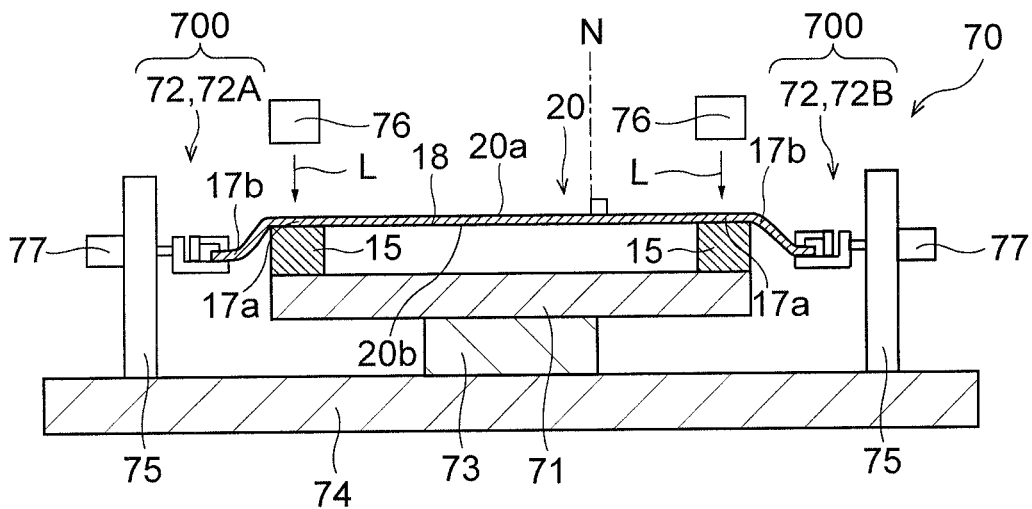
[FIG. 19B]

Next, as depicted in FIG. 19B, a joining step of joining the weld section 17a of the vapor deposition mask 20 to the frame 15 is performed. In this case, in the state in which a tension is applied to the vapor deposition mask 20, the weld section 17a of the vapor deposition mask 20 is joined to the frame 15. In this instance, for example, laser light L is applied from the first surface 20a side of the vapor deposition mask 20 by the welding device 76. By this, as illustrated in FIG. 5A, part of the ear parts 17 of the vapor deposition mask 20 and part of the frame 15 are melted, and the molten region 19f extending from the first surface 20a of the ear part 17 through the second surface 20b to the frame 15 is formed. The molten region 19f lies in both the ear part 17 and the frame 15.

As the laser light L, there can be used, for example, YAG laser light produced by a YAG laser device. As the YAG laser device, there can be used one in which a crystal of YAG (yttrium aluminum garnet) with Nd (neodymium) added thereto is included as an oscillation medium. In this case, as a fundamental wave, laser light of a wavelength of approximately 1,064 nm is produced. In addition, by passing the fundamental wave through a nonlinear optical crystal, a second harmonic of a wavelength of approximately 532 nm is produced. Besides, by passing the fundamental wave and the second harmonic through a nonlinear optical crystal, a third harmonic of a wavelength of approximately 355 nm is produced.

The third harmonic of the YAG laser light is liable to be absorbed in a nickel-containing iron alloy. Therefore, in a case where the ear parts 17 of the vapor deposition mask 20 and the frame 15 include the nickel-containing iron alloy, it is preferable that the laser light L contains the third harmonic of the YAG laser light, for efficiently melting part of the ear parts 17 of the vapor deposition mask 20 and the frame 15.

When the application of the laser light L is finished, the temperature of the molten regions 19f is lowered, and the molten regions 19f are solidified, to be the weld marks 19a. As a result, the ear parts 17 of the vapor deposition mask 20 and the frame 15 are joined to each other by the weld marks 19a. In this way, the vapor deposition mask device 10 including the frame 15 and the vapor deposition mask 20 joined to the frame 15 by the joint 19 can be obtained.

Vapor Deposition Method for Vapor Deposition Material

A vapor deposition method for a vapor deposition material by which to vapor deposit the vapor deposition material 98 onto the organic EL substrate 92 by use of the vapor deposition mask device 10 obtained by the aforementioned steps will be described below, referring mainly to FIGS. 20A to 21.

Figure 20A:
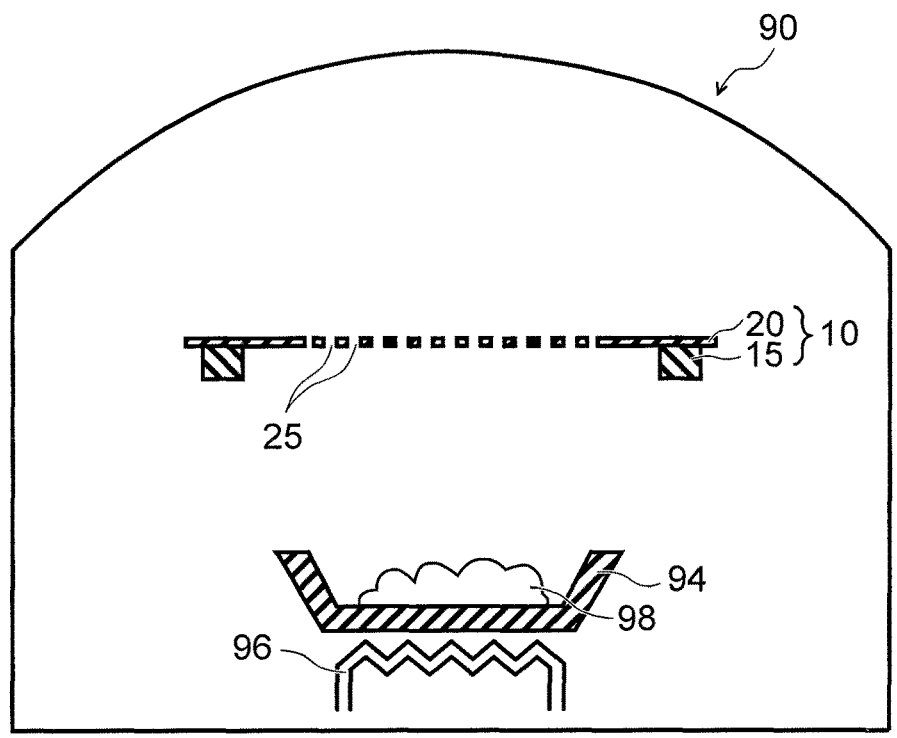
[FIG. 20A]
Figure 21:
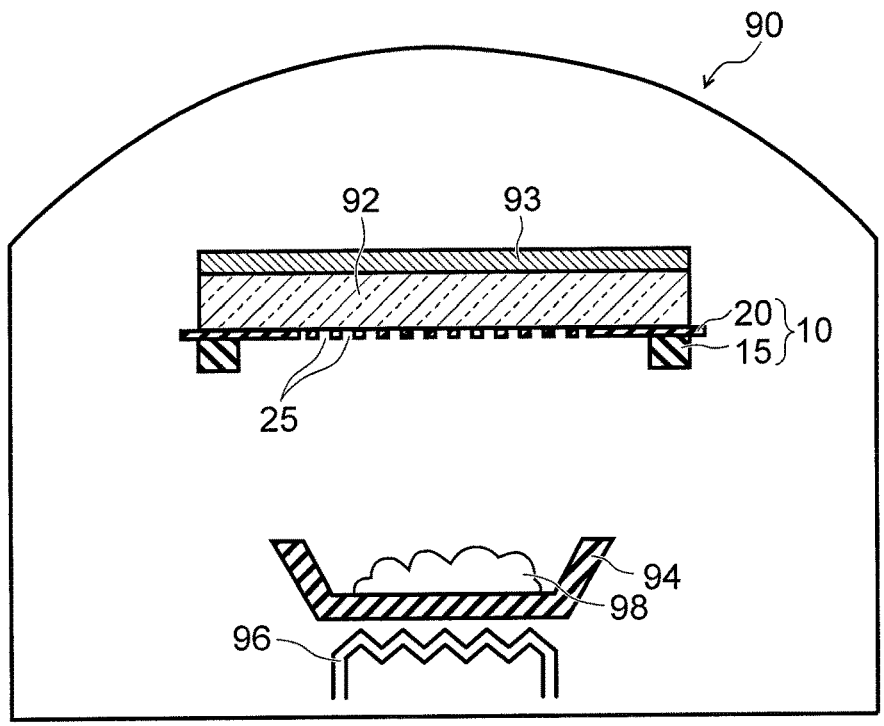
[FIG. 21]

First, as illustrated in FIG. 20A, the vapor deposition mask device 10 obtained by the aforementioned steps is prepared. In this instance, the crucible 94 accommodating the vapor deposition material 98 and the heater 96 are prepared, and the vapor deposition device 90 is prepared.

In addition, the organic EL substrate 92 is prepared.

Figure 20B:
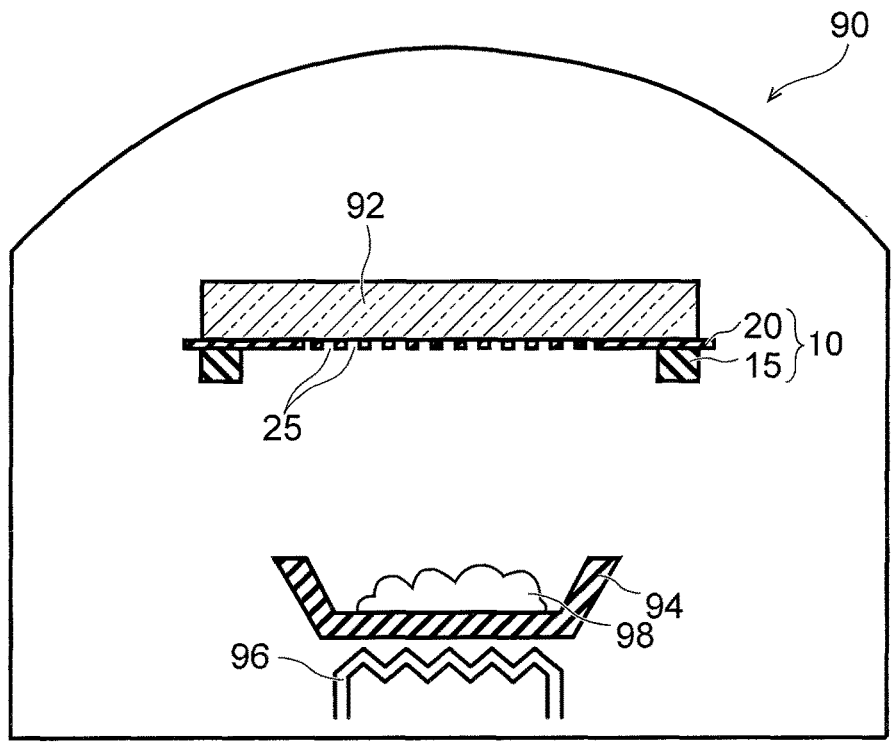
[FIG. 20B]

Next, as depicted in FIG. 20B, the organic EL substrate 92 is placed on the vapor deposition mask 20 of the vapor deposition mask device 10. In this instance, for example, an alignment mark (not illustrated) of the organic EL substrate 92 and an alignment mark (not illustrated) of the vapor deposition mask 20 are observed directly, and, while positioning the organic EL substrate 92 such that the alignment marks overlap with each other, the organic EL substrate 92 is disposed on the vapor deposition mask device 10.

Next, the vapor deposition material 98 is vapor deposited on the organic EL substrate 92 disposed on the vapor deposition mask 20 of the vapor deposition mask device 10. In this instance, as depicted in FIG. 21, the magnet 93 is disposed on a surface, on the opposite side from the vapor deposition mask device 10, of the organic EL substrate 92. With the magnet 93 thus provided, the vapor deposition mask device 10 can be attracted toward the magnet 93 side by a magnetic force, and the vapor deposition mask 20 can be put into close contact with the organic EL substrate 92. Next, the inside of the vapor deposition device 90 is evacuated by evacuation means (not illustrated) such that the inside of the vapor deposition device 90 is put into a high vacuum state. Subsequently, the heater 96 heats the crucible 94, to evaporate the vapor deposition material 98. Then, the vapor deposition material 98 evaporated from the crucible 94 and reaching the vapor deposition mask device 10 is deposited on the organic EL substrate 92 by passing through the through-holes 25 of the vapor deposition mask 20 (see FIG. 1).

In this way, the vapor deposition material 98 is vapor deposited on the organic EL substrate 92 in a desired pattern corresponding to the positions of the through-holes 25 of the vapor deposition mask 20.

According to the present embodiment, the manufacturing apparatus 70 includes the clamps 72 for clamping the extension sections 17b. In addition, in a state in which the clamps 72 clamp the vapor deposition mask 20, the second surface 20b of the weld section 17a is in close contact with the front surface 15a of the frame 15, and the second surface 20b of the extension section 17b is at least partly located toward the back surface 15b of the frame 15 rather than the front surface 15a of the frame 15. In other words, at least part of the second surface 20b of the vapor deposition mask 20 is in close contact with the front surface (or the third surface) 15a of the frame 15, and, as viewed from the normal direction N of the first surface 20a of the vapor deposition mask 20, at least part of the second surface 20b of a part of the vapor deposition mask 20, which does not overlap with the frame 15, is located toward the back surface (or the fourth surface) 15b rather than the front surface (or the third surface) 15a of the frame 15. By this, the vapor deposition mask 20 can be pulled toward the back surface 15b of the frame 15 rather than the front surface 15a of the frame 15. Therefore, at the time of tensioning the vapor deposition mask 20, adhesion between the vapor deposition mask 20 and the frame 15 can be enhanced. As a result, generation of flexure or a wavy shape in the vapor deposition mask 20 can be restrained. In addition, since the vapor deposition mask 20 can be put into close contact with the frame 15, weld strength of the weld section of the vapor deposition mask 20 can be enhanced.

In addition, according to the present embodiment, the stage 71 is movable in the normal direction N. This makes it possible to control the positional relation between the frame 15 and the clamps 72. As a result, the pulling tension generated in the vapor deposition mask 20 can be controlled, and generation of flexure or a wavy shape in the vapor deposition mask 20 can be restrained more effectively.

Note that various modifications can be added to the aforementioned embodiment. Modifications will be described below, referring to the drawings, as required. In the following description and in the drawings used in the following description, the parts which can be configured in a similar manner to those in the aforementioned embodiment are denoted by the same symbols as used above for those parts in the aforementioned embodiment, and repeated descriptions of them will be omitted. In addition, in a case where it is apparent that an effect obtained in the aforementioned embodiment is obtained also in the modifications, the description thereof may be omitted.

Modification of Manufacturing Method for Vapor Deposition Mask

In the aforementioned present embodiment and modification, an example in which the vapor deposition mask 20 is produced by etching has been described. However, the method adopted for producing the vapor deposition mask 20 is not limited to etching. For example, as disclosed in the aforementioned Patent Document 2, the vapor deposition mask 20 may be produced by forming the through-holes 25 in the metallic plate by a plating treatment.

Modification of Ear Part

In the aforementioned present embodiment and modification, an example in which the thickness of the ear parts 17 of the vapor deposition mask 20 and the thickness of the intermediate part 18 are equal has been described. However, this is not limitative, and the thickness of the ear parts 17 and the thickness of the intermediate part 18 may be different from each other.

Modification of Frame

Figure 22A:
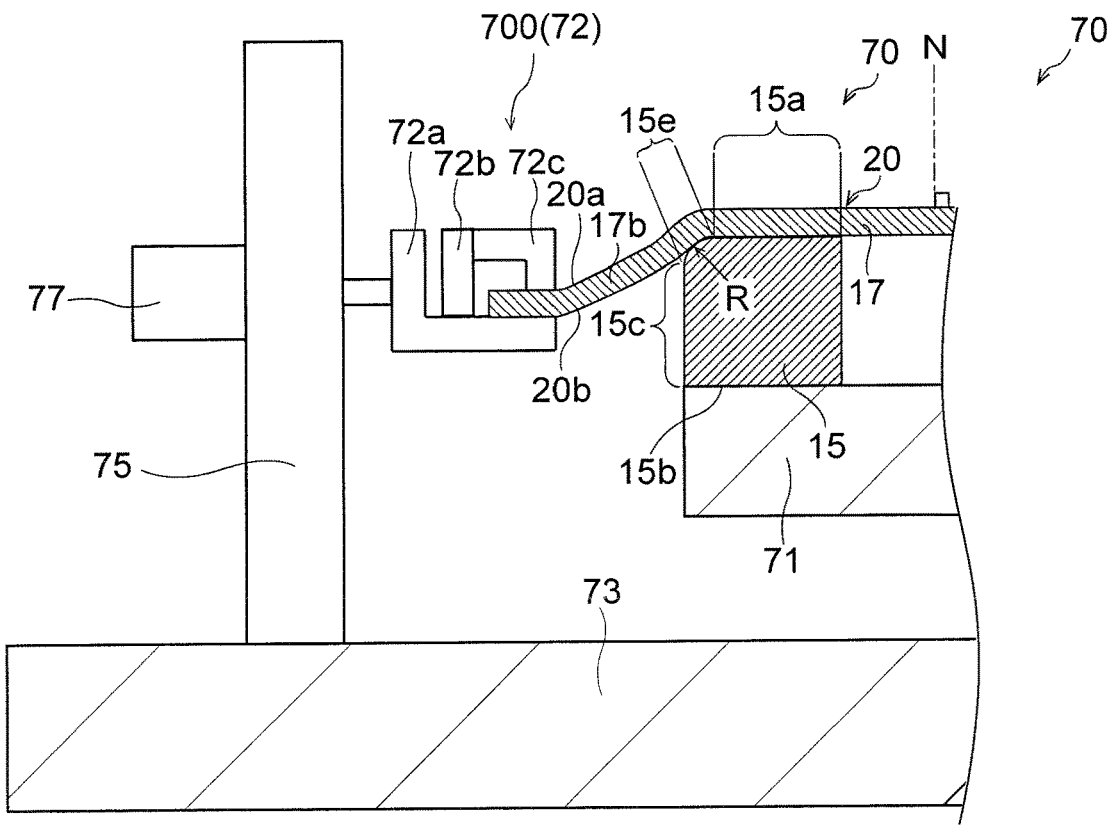
[FIG. 22A]

In the aforementioned present embodiment and modification, an example in which the outside surfaces 15c of the frame 15 are orthogonally connected to the front surface 15a when viewed along the normal direction N of the first surface 20a of the vapor deposition mask 20 has been described. However, this is not limitative; as depicted in FIG. 22A, a connection surface (or the sixth surface) 15e that connects the front surface (or the third surface) 15a and the outside surface (or the fifth surface) 15c may be provided between the front surface (or the third surface) 15a and the outside surface (or the fifth surface) 15c. Note that in the example illustrated in FIG. 22A, the front surface 15a extends in parallel to a direction orthogonal to the normal direction N of the first surface 20a of the vapor deposition mask 20, and the outside surface 15c extends in the normal direction N, when viewed in a section along the normal direction N. The connection surface 15e is provided between the front surface 15a and the outside surface 15c. In this case, the connection surface 15e may be a so-called chamfered part.

Incidentally, before the joining step of joining the vapor deposition mask 20 to the frame 15 is conducted, a position adjustment step of adjusting the position of the vapor deposition mask 20 in a plane direction of the frame 15 may be carried out. In this instance, it is considered that the vapor deposition mask 20 may be in close contact with the part where the front surface 15a and the outside surface 15c are connected.

In addition, it is also considered that at the time of the tensioning step of applying tension to the vapor deposition mask 20, a local force may be exerted on a part of the vapor deposition mask 20, which is in close contact with the part where the front surface 15a and the outside surface 15c are connected.

In this regard, according to the present modification, the connection surface 15e is formed, whereby the front surface 15a and the outside surface 15c can be smoothly connected. In addition, at the time of the position adjustment step, when the vapor deposition mask 20 is in close contact with the frame 15 or when the vapor deposition mask 20 is tensioned by the clamps 72, a local force can be prevented from being exerted on the vapor deposition mask 20. Therefore, friction between the vapor deposition mask 20 and the frame 15 can be reduced, and damaging of the vapor deposition mask 20 can be restrained.

In addition, in this case, the profile of the connection surface (or the sixth surface) 15e has at least partly an arcuate shape protuberant toward the vapor deposition mask 20, when viewed along the normal direction N of the first surface 20a, and the radius of curvature R of the arcuate shape is preferably equal to or more than 0.01 mm, and more preferably equal to or more than 0.1 mm. With the radius of curvature R set equal to or more than 0.01 mm, a local force can be prevented from being exerted on the vapor deposition mask 20 when the vapor deposition mask 20 is tensioned by the clamps 72, and a frictional force acting on the vapor deposition mask 20 can be reduced effectively. Besides, with the radius of curvature R set equal to or more than 0.1 mm, a local force can be further retrained from being exerted on the vapor deposition mask 20 when the vapor deposition mask 20 is tensioned by the clamps 72, and a frictional force acting on the vapor deposition mask 20 can be reduced more effectively. In addition, the radius of curvature R of the arcuate shape is preferably equal to or less than 2.00 mm, and more preferably equal to or less than 1.50 mm. With the radius of curvature R set equal to or less than 2.00 mm, the front surface 15a and the outside surface 15c can be smoothly connected, and, at the time of the position adjustment step, when the vapor deposition mask 20 is in close contact with the frame 15 or when the vapor deposition mask 20 is tensioned by the clamps 72, a local force can be restrained from being exerted on the vapor deposition mask 20. Besides, with the radius of curvature R set equal to or less than 1.50 mm, the front surface 15a and the outside surface 15c can be connected further smoothly, and, at the time of the position adjustment step, when the vapor deposition mask 20 is in close contact with the frame 15 or when the vapor deposition mask 20 is tensioned by the clamps 72, a local force can be further restrained from being exerted on the vapor deposition mask 20.

Such a radius of curvature R may be, for example, equal to or more than 0.01 mm, or may be equal to or more than 0.05 mm, or may be equal to or more than 0.15 mm, or may be equal to or more than 0.20 mm. In addition, the radius of curvature R may be equal to or less than 2.00 mm, or may be equal to or less than 1.50 mm, or may be equal to or less than 1.00 mm, or may be equal to or less than 0.50 mm. The radius of curvature R may be determined by a combination of arbitrary one of the aforementioned plurality of upper limit candidate values and arbitrary one of the aforementioned plurality of lower limit candidate values. For example, the radius of curvature R may be equal to or more than 0.01 mm to equal to or less than 2.00 mm, or may be equal to or more than 0.05 mm to equal to or less than 1.50 mm, or may be equal to or more than 0.15 mm to equal to or less than 1.00 mm, or may be equal to or more than 0.20 mm to equal to or less than 0.50 mm. Besides, the radius of curvature R may be determined by a combination of arbitrary two of the aforementioned plurality of upper limit candidate values. For instance, the radius of curvature R may be equal to or more than 0.50 mm to equal to or less than 1.50 mm. In addition, the radius of curvature R may be determined by a combination of arbitrary two of the aforementioned plurality of lower limit candidate values. For example, the radius of curvature R may be equal to or more than 0.01 mm to equal to or less than 0.20 mm.

Figure 22B:
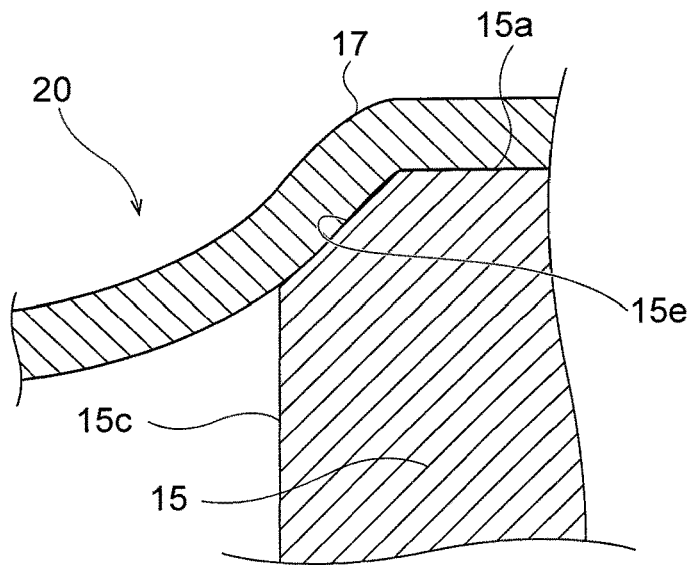
[FIG. 22B]
Figure 22C:
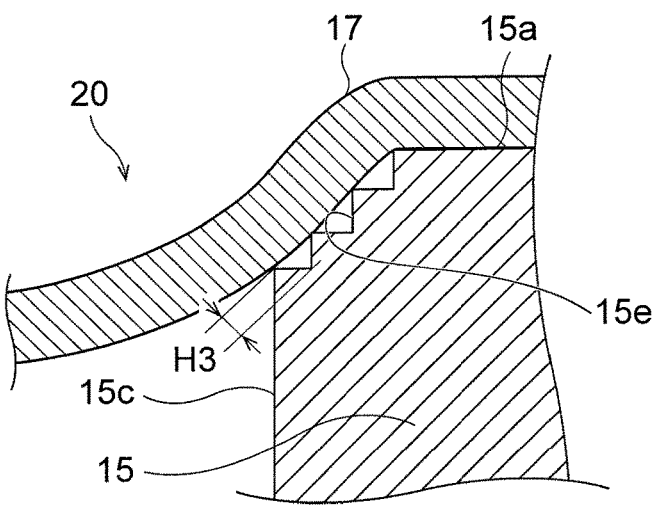
[FIG. 22C]

In addition, the profile of the connection surface (or the sixth surface) 15e may have various shapes when viewed along the normal direction N of the first surface 20a. For instance, as depicted in FIG. 22B, the profile of the connection surface (or the sixth surface) 15e may be rectilinear when viewed along the normal direction N of the first surface 20a.

Figure 22D:
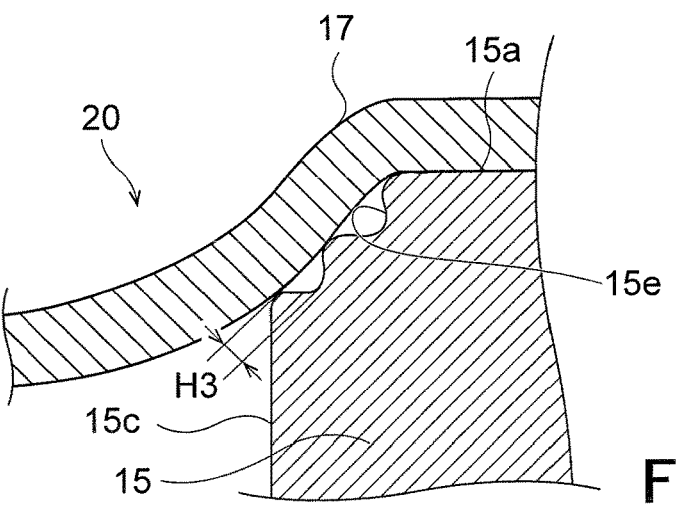
[FIG. 22D]

Besides, the profile of the connection surface (or the sixth surface) 15e may have a rugged shape, i.e., projected and recessed shape, when viewed along the normal direction N of the first surface 20a. For example, the profile of the connection surface (or the sixth surface) 15e may form a step when viewed along the normal direction N of the first surface 20a. In this case, at the time of the position adjustment step, when the vapor deposition mask 20 is in close contact with the frame 15 or when the vapor deposition mask 20 is tensioned by the clamps 72, exertion of a local force on the vapor deposition mask 20 can be further restrained. Therefore, friction between the vapor deposition mask 20 and the frame 15 can be reduced, and damaging of the vapor deposition mask 20 can be further restrained. Further, for example, as depicted in FIG. 22D, the profile of the connection surface (or the sixth surface) 15e may have a wavy shape when viewed along the normal direction N of the first surface 20a. In this case, at the time of the position adjustment step, when the vapor deposition mask 20 is in close contact with the frame 15 or when the vapor deposition mask 20 is tensioned by the clamps 72, exertion of a local force on the vapor deposition mask 20 can be restrained more effectively. Therefore, friction between the vapor deposition mask 20 and the frame 15 can be reduced, and damaging of the vapor deposition mask 20 can be restrained more effectively. In these cases, the height H3 of the rugged shape (the difference between the most projected part and the most recessed part) may be, for example, equal to or more than 0.01 mm, or may be equal to or more than 0.05 mm, or may be equal to or more than 0.10 mm, or may be equal to or more than 0.50 mm, or may be equal to or more than 1.00 mm. Besides, the height H3 of the rugged shape may be equal to or less than 3.00 mm, or may be equal to or less than 2.50 mm, or may be equal to or less than 2.00 mm. The height H3 of the rugged shape may be determined by a combination of arbitrary one of the aforementioned plurality of upper limit candidate values and arbitrary one of the aforementioned plurality of lower limit candidate values. For instance, the height H3 of the rugged shape may be equal to or more than 0.01 mm to equal to or less than 3.00 mm, or may be equal to or more than 0.05 mm to equal to or less than 2.50 mm, or may be equal to or more than 1.00 mm to equal to or less than 2.00 mm. In addition, the height H3 of the rugged shape may be determined by a combination of arbitrary two of the aforementioned plurality of upper limit candidate values. For example, the height H3 of the rugged shape may be equal to or more than 2.00 mm to equal to or less than 2.50 mm. Besides, the height H3 of the rugged shape may be determined by a combination of arbitrary two of the aforementioned plurality of lower limit candidate values. For instance, the height H3 of the rugged shape may be equal to or more than 0.01 mm to equal to or less than 0.50 mm. In addition, with the height H3 of the rugged shape being equal to or more than 0.01 mm, the formability of the rugged shape can be enhanced, and the connection surface 15e can be easily formed. Besides, with the height H3 of the rugged shape being equal to or less than 3.00 mm, at the time of the position adjustment step, when the vapor deposition mask 20 is in close contact with the frame 15 or when the vapor deposition mask 20 is tensioned by the clamps 72, exertion of a local force on the vapor deposition mask 20 can be further restrained. Therefore, friction between the vapor deposition mask 20 and the frame 15 can be reduced, and damaging of the vapor deposition mask 20 can be restrained further.

First Modification of Manufacturing Apparatus for Vapor Deposition Mask Device

In the present embodiment described above, an example in which the stage 71 of the manufacturing apparatus 70 is moved in the normal direction N of the first surface 20a has been described. However, this is not limitative, and, for example, the jig 700 may be moved in the normal direction N of the first surface 20a. In this case, for example, at least one of the first clamp 72A and the second clamp 72B may be moved in the normal direction N of the first surface 20a.

Figure 23:
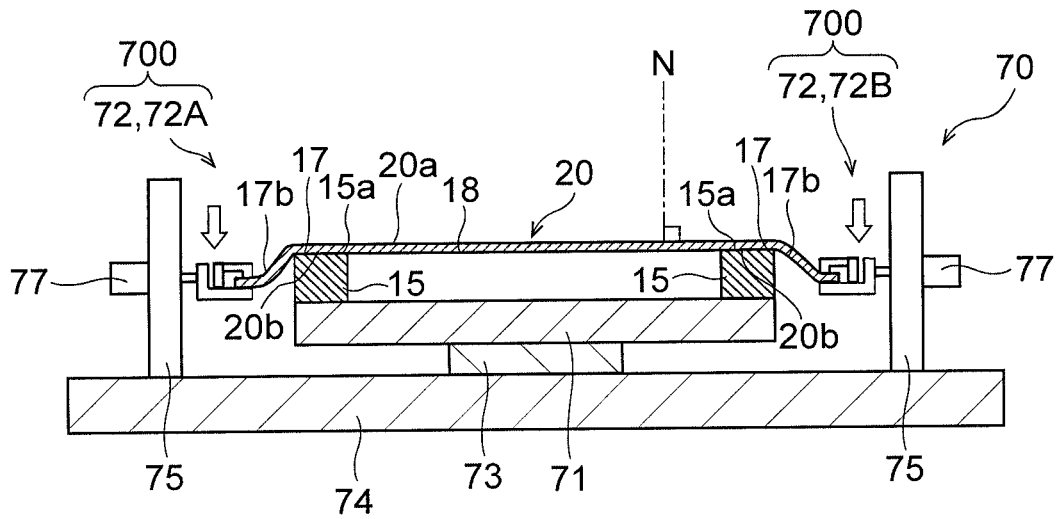
[FIG. 23]

In this case, as depicted in FIG. 23, by driving the driving means 77, the clamp 72 is moved in the normal direction N of the first surface 20a. By this, at least one of the first clamp 72A and the second clamp 72B can be movable in the normal direction N of the first surface 20a. In this case, also, the positional relation between the frame 15 and the clamp 72 can be adjusted, and a tension can be applied to the vapor deposition mask in such a manner that the second surface 20b of the weld section 17a is in close contact with the front surface 15a of the frame 15 and the second surface 20b of the extension section 17b is at least partly located toward the back surface 15b of the frame 15 rather than the front surface 15a of the frame 15. In a case where the first clamp 72A and the second clamp 72B are each movable in the normal direction N of the first surface 20a, they may be configured to be moved in cooperation or may be configured to be moved independently. Note that in this case, the stage 71 of the manufacturing apparatus 70 may be moved in the normal direction N of the first surface 20a together with the jig 700.

Second Modification of Manufacturing Apparatus for Vapor Deposition Mask Device

In the aforementioned modification, an example in which at least one of the first clamp 72A and the second clamp 72B is moved in the normal direction N of the first surface 20a in the tensioning step of applying tension to the vapor deposition mask 20 has been described. However, this is not limitative, and, for example, the jig 700 may be moved along a plane direction of the first surface 20a. In this case, for example, at least one of the first clamp 72A and the second clamp 72B may be moved along a plane direction of the first surface 20a. In this instance, for example, at least one of the first clamp 72A and the second clamp 72B may be moved in such a direction that the first clamp 72A and the second clamp 72B are spaced away from each other.

Figure 24:
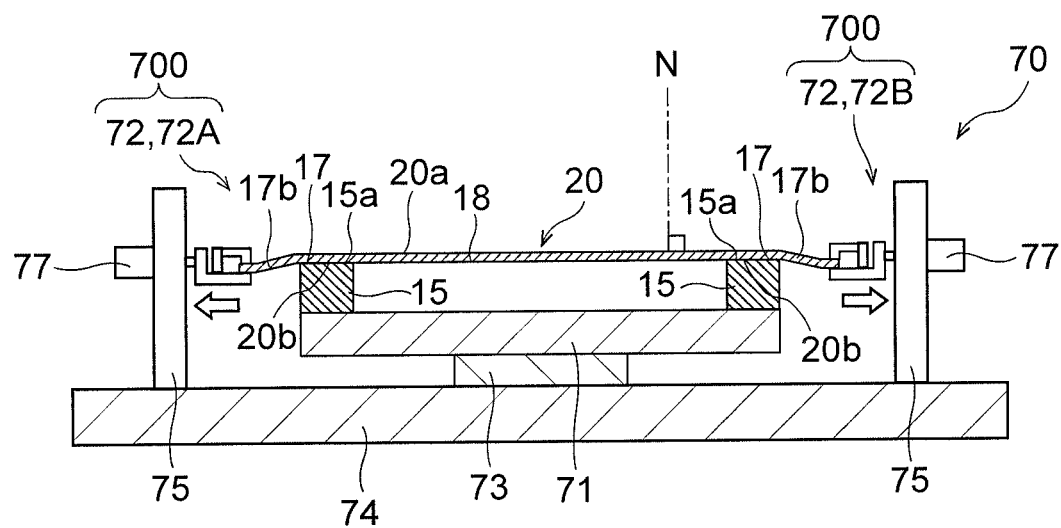
[FIG. 24]

In this case, as depicted in FIG. 24, by driving the driving means 77, at least one of the first clamp 72A and the second clamp 72B is moved in a plane direction of the first surface 20a of the vapor deposition mask 20. In this case, also, the positional relation between the frame 15 and the clamp 72 can be adjusted, and a tension can be applied to the vapor deposition mask in such a manner that the second surface 20b of the weld section 17a is in close contact with the front surface 15a of the frame 15 and the second surface 20b of the extension section 17b is at least partly located toward the back surface 15b of the frame 15 rather than the front surface 15a of the frame 15. Note that in this case, also, the jig 700 may be moved in a plane direction of the first surface 20a of the vapor deposition mask 20 and moved in the normal direction N of the first surface 20a. Further, the stage 71 of the manufacturing apparatus 70 may be moved in the normal direction N of the first surface 20a together with the jig 700.

Figure 25:
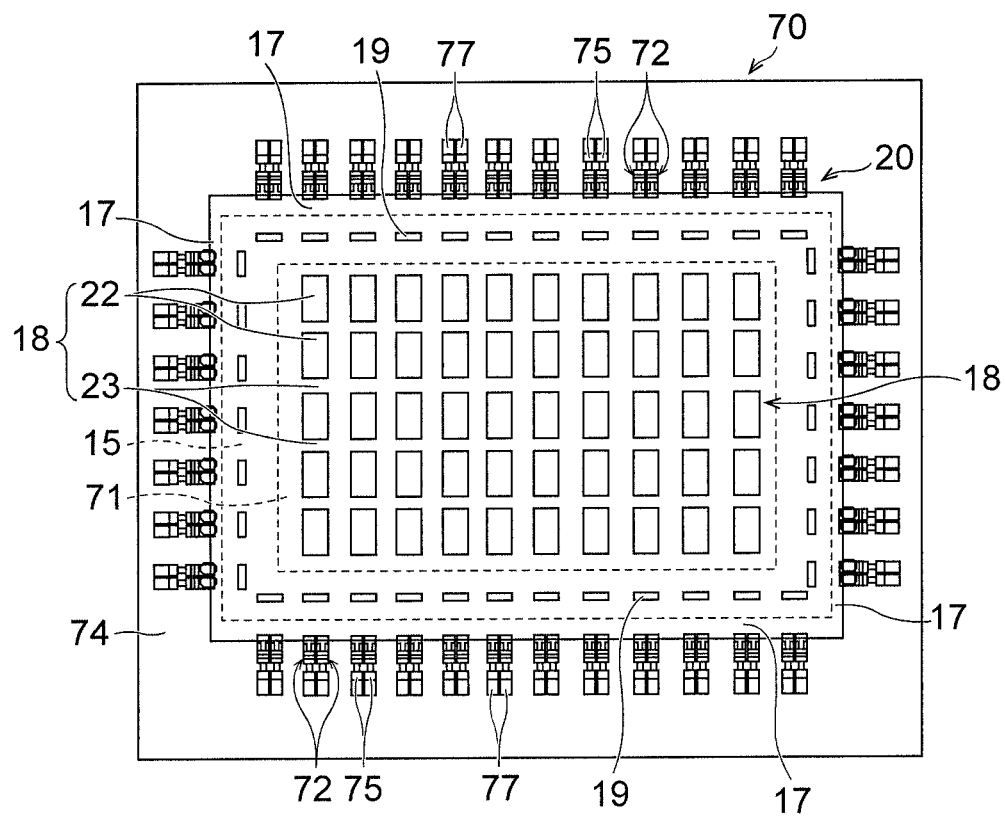
[FIG. 25]

Third Modification of Manufacturing Apparatus for Vapor Deposition Mask Device Besides, in the present embodiment described above, an example in which the vapor deposition mask device 10 manufactured by the manufacturing apparatus 70 is a vapor deposition mask device 10 having the plurality of vapor deposition masks 20 allocated to the frame 15 has been described. However, this is not limitative; as illustrated in FIG. 25, the vapor deposition mask device 10 may be a single vapor deposition mask 20 having a plurality of effective regions 22 arranged in a grid pattern. In this case, the manufacturing apparatus 70 may include clamps 72 corresponding to the four sides of the vapor deposition mask 20 such that the extension sections 17b of the ear parts 17 are clamped at the four sides of the vapor deposition mask 20.

Figure 26A:
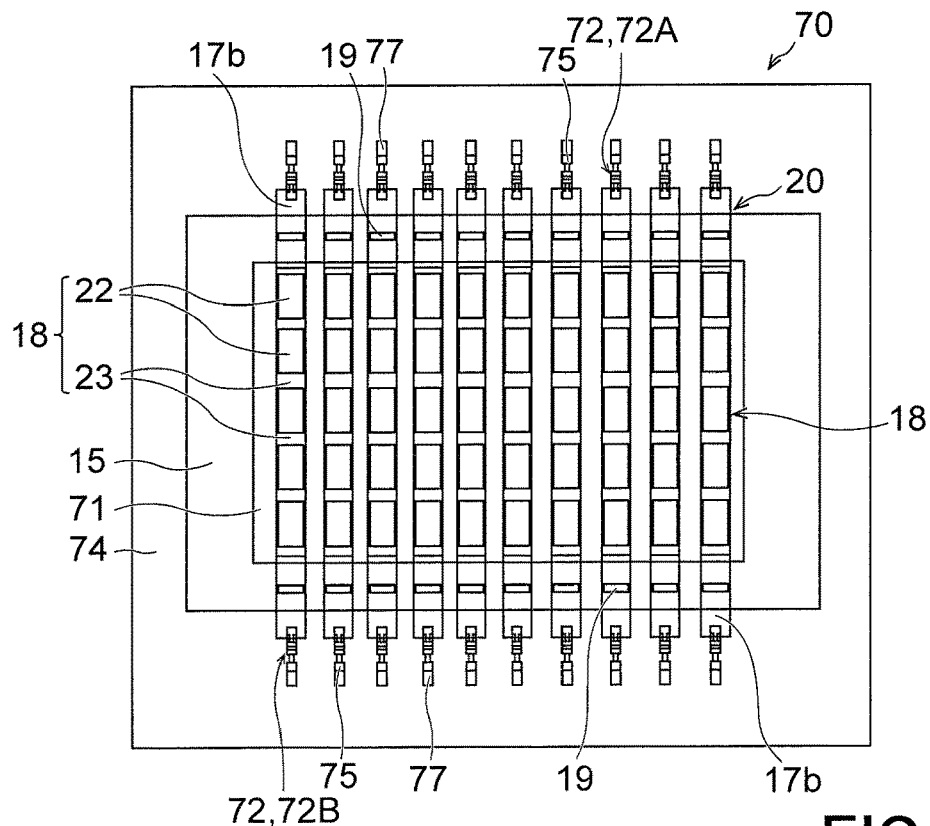
[FIG. 26A]

Fourth Modification of Manufacturing Apparatus for Vapor Deposition Mask Device In addition, in the present embodiment described above, for example, an example in which the manufacturing apparatus 70 is configured such as to clamp one extension section 17b by two clamps 72 has been described. However, this is not limitative; as depicted in FIG. 26A, the number of the clamp or clamps 72 for grasping one extension section 17b may be one. In this case, also, a tension can be applied to the vapor deposition mask in such a manner that the second surface 20b of the weld section 17a is in close contact with the front surface 15a of the frame 15 and the second surface 20b of the extension section 17b is at least partly located toward the back surface 15b of the frame 15 rather than the front surface 15a of the frame 15.

Figure 26B:
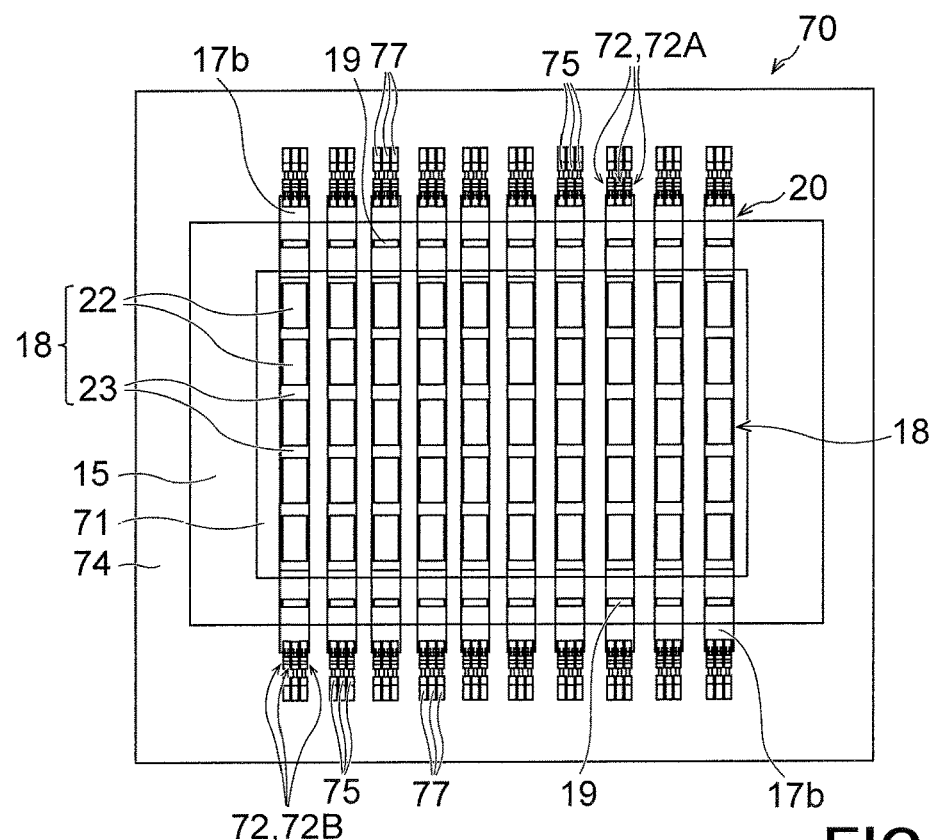
[FIG. 26B]

Fifth Modification of Manufacturing Apparatus for Vapor Deposition Mask Device Besides, as depicted in FIG. 26B, the number of the clamps 72 for grasping one extension section 17b may be three. In this case, a tension can be applied to the vapor deposition mask 20 more effectively.

Figure 27:
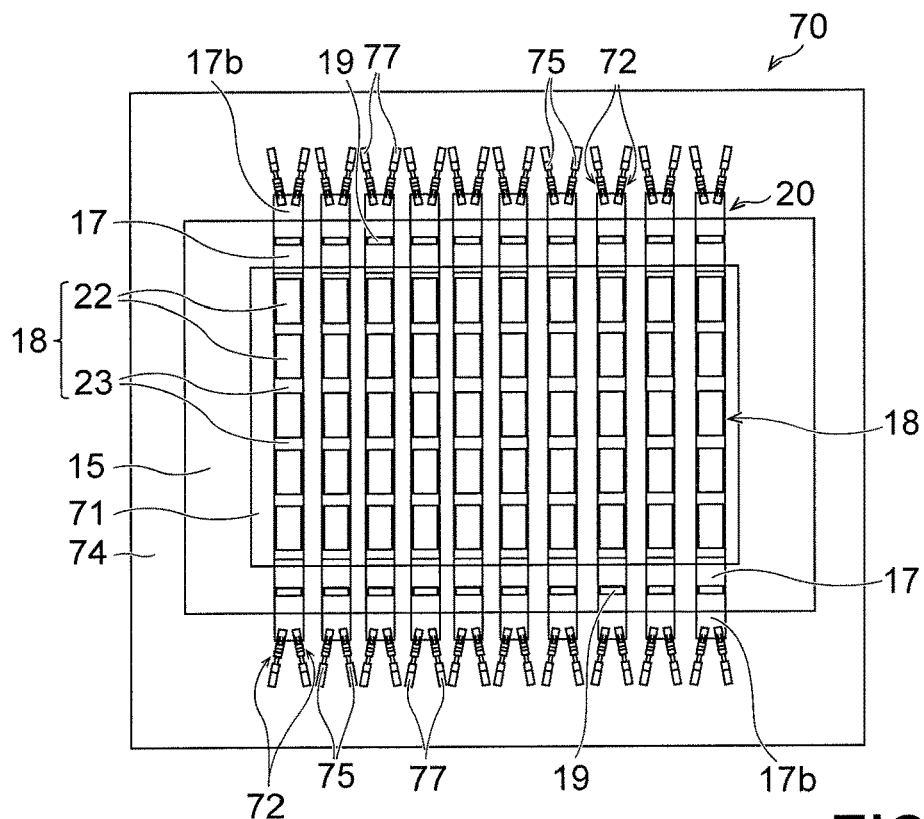
[FIG. 27]

Sixth Modification of Manufacturing Apparatus for Vapor Deposition Mask Device In addition, in the present embodiment described above, an example in which the manufacturing apparatus 70 is configured such that one extension section 17b is clamped by two clamps 72 and the two clamps 72 are disposed in parallel to each other has been described. However, this is not limitative; as illustrated in FIG. 27, the two clamps 72 may be disposed in such a manner that they are spaced more away from each other in going toward the outside of the vapor deposition mask 20. In this case, a tension can be more effectively applied to the vapor deposition mask 20 along a plane direction of the first surface 20a. Therefore, adhesion between the vapor deposition mask 20 and the frame 15 can be further enhanced. As a result, generation of flexure or a wavy shape in the vapor deposition mask 20 can be restrained more effectively.

Figure 28:
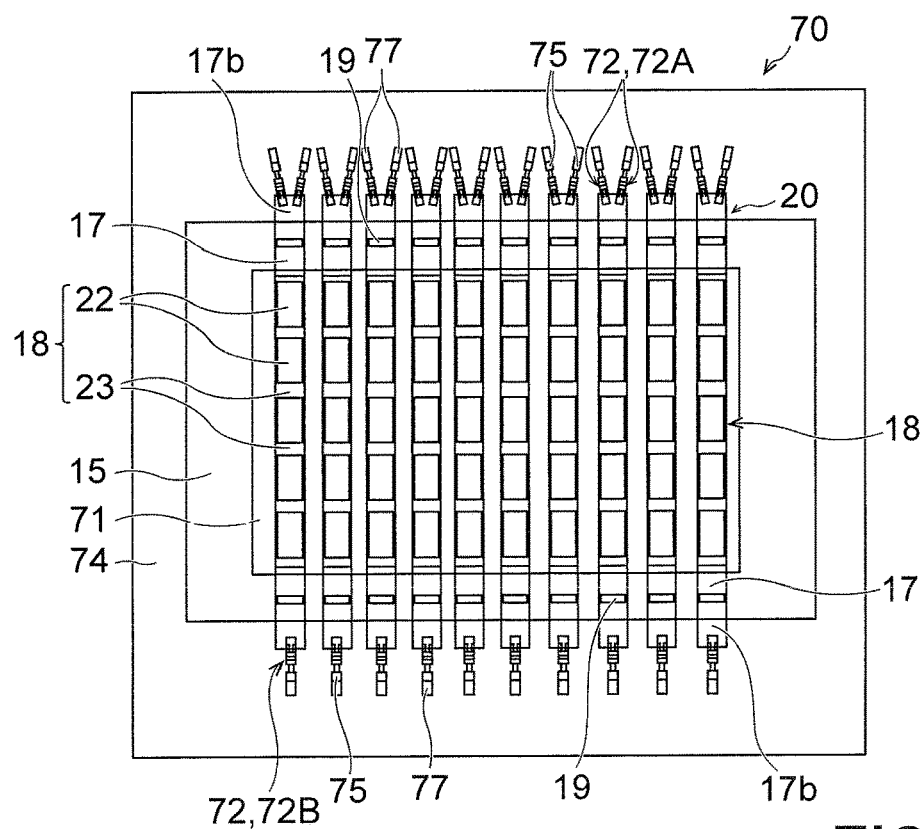
[FIG. 28]

Seventh Modification of Manufacturing Apparatus for Vapor Deposition Mask Device Besides, as illustrated in. FIG. 28, the extension section 17b of one of the pair of ear parts 17 of the vapor deposition mask 20 may be clamped by two first clamps 72A, and the extension section 17b of the other of the pair of ear parts 17 of the vapor deposition mask 20 may be clamped by one second clamp 72B. In this case, the two first clamps 72A may be disposed in such a manner that the two clamps 72A are spaced more away from each other in going toward the outside of the vapor deposition mask 20. Note that though not illustrated, the extension section 17b of one of the pair of ear parts 17 of the vapor deposition mask 20 may be clamped by one first clamp 72A, and the extension section 17b of the other of the pair of ear parts 17 of the vapor deposition mask 20 may be clamped by two second clamps 72B. In this case, the two second clamps 72B may be disposed in such a manner that the two clamps 72B are spaced more away from each other in going toward the outside of the vapor deposition mask 20. In this case, also, a tension can be effectively applied to the vapor deposition mask 20 along a plane direction of the first surface 20a. Therefore, adhesion between the vapor deposition mask 20 and the frame 15 can be further enhanced. As a result, generation of flexure or a wavy shape in the vapor deposition mask 20 can be restrained effectively.

Figure 29:
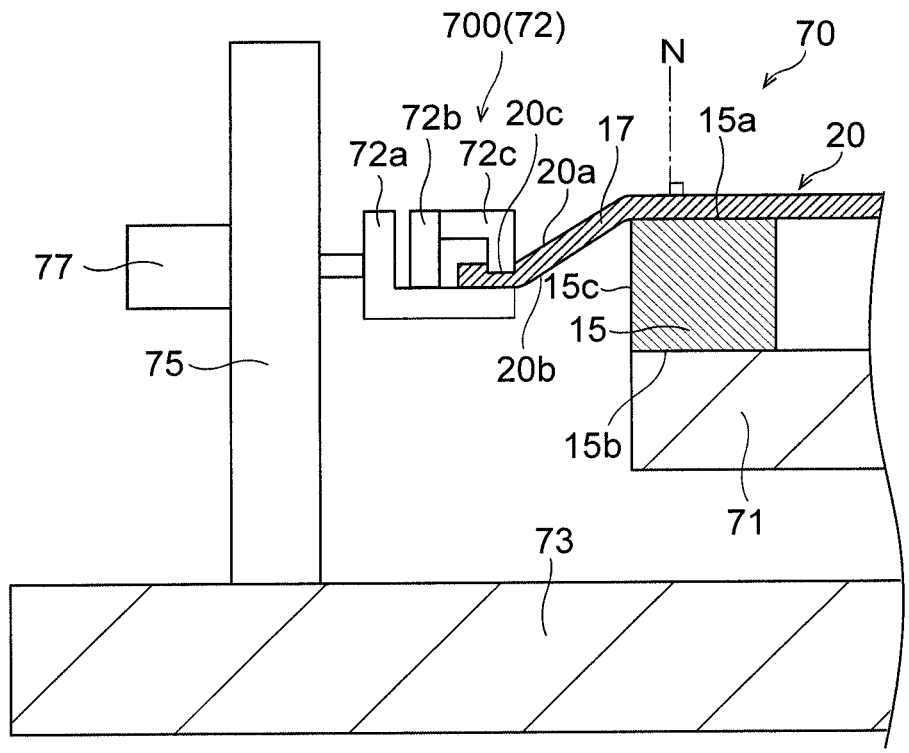
[FIG. 29]

Eighth Modification of Manufacturing Apparatus for Vapor Deposition Mask Device In addition, in the present embodiment described above, an example in which the jig 700 is the clamps 72 and the clamps 72 clamp the vapor deposition mask 20 has been described. However, this is not limitative; as depicted in FIG. 29, a configuration may be adopted in which the first surface 20a of the vapor deposition mask 20 is formed with recesses 20c, and the movable sections 72c of the clamps 72 are fitted into the recesses 20c. In this case, also, since the clamps 72 can support the vapor deposition mask 20, a tension can be applied to the vapor deposition mask 20.

Figure 30:
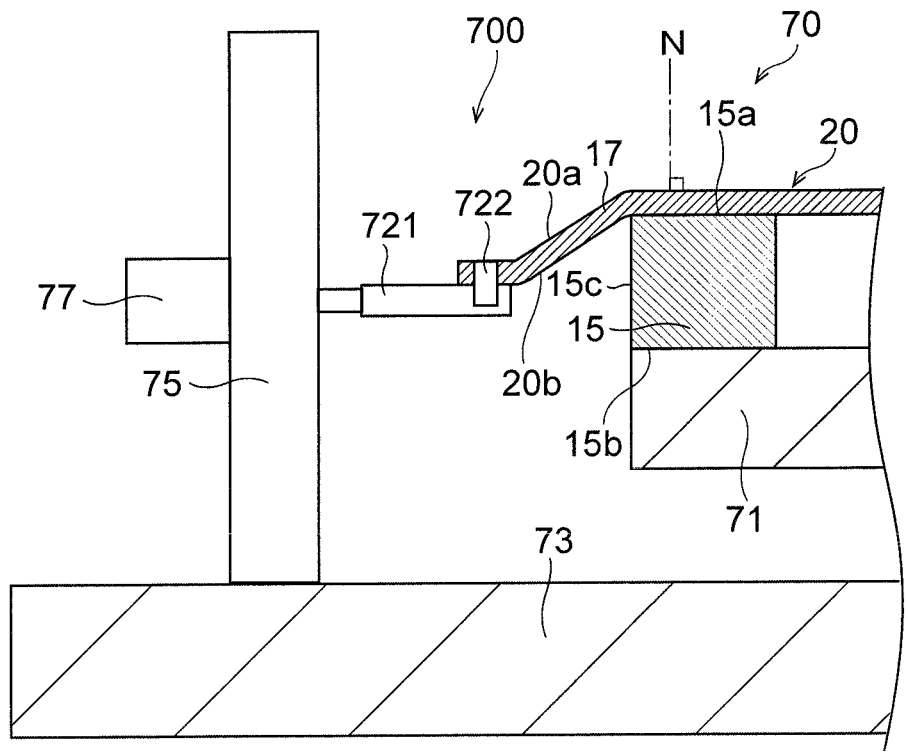
[FIG. 30]

Ninth Modification of Manufacturing Apparatus for Vapor Deposition Mask Device Besides, in the present embodiment described above, an example in which the jig 700 is the clamps 72 has been described. However, this is not limitative; as depicted in FIG. 30, the jig 700 may include support plates 721. In this case, by welding the vapor deposition mask 20 to the support plates 721, the vapor deposition mask 20 can be fixed to the support plates 721. Note that a symbol 722 denotes marks formed in part of the vapor deposition mask 20 and support plates 721 due to the welding of the vapor deposition mask 20 to the support plates 721. In this case, since the jig 700 can firmly support the vapor deposition mask 20, adhesion between the vapor deposition mask 20 and the frame 15 can be further enhanced.

Tenth Modification of Manufacturing Apparatus for Vapor Deposition Mask Device

Figure 31:
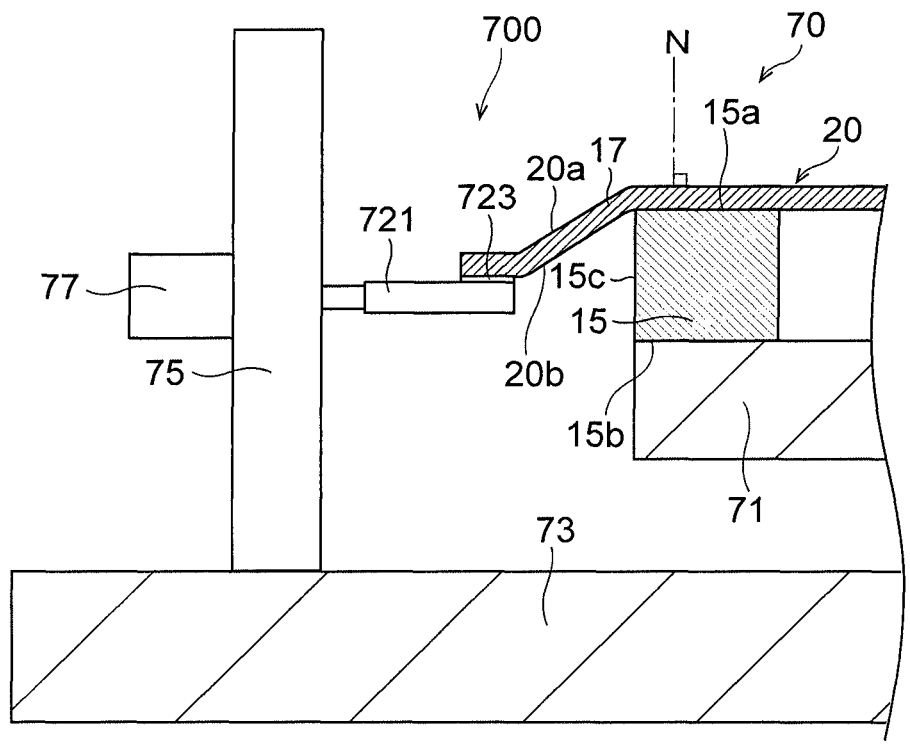
[FIG. 31]

In addition, as illustrated in FIG. 31, the vapor deposition mask 20 may be fixed to the support plates 721 by an adhesive 723. In this case, also, since the jig 700 can firmly support the vapor deposition mask 20, adhesion between the vapor deposition mask 20 and the frame 15 can be further enhanced.

Eleventh Modification of Manufacturing Apparatus for Vapor Deposition Mask Device Besides, as depicted in FIG. 31, the jig 700 may include the support plates 721 and projections 724 projecting from the support plates 721. In this case, the second surface 20b of the vapor deposition mask 20 is formed with the recesses 20c, and the projections 724 fit into the recesses 20c. By this, the jig 700 can support the vapor deposition mask 20. In this case, the jig 700 can support the vapor deposition mask 20 with a simple structure, and, at the time of detaching the vapor deposition mask 20 from the jig 700, the vapor deposition mask 20 can be easily detached.

Figure 32:
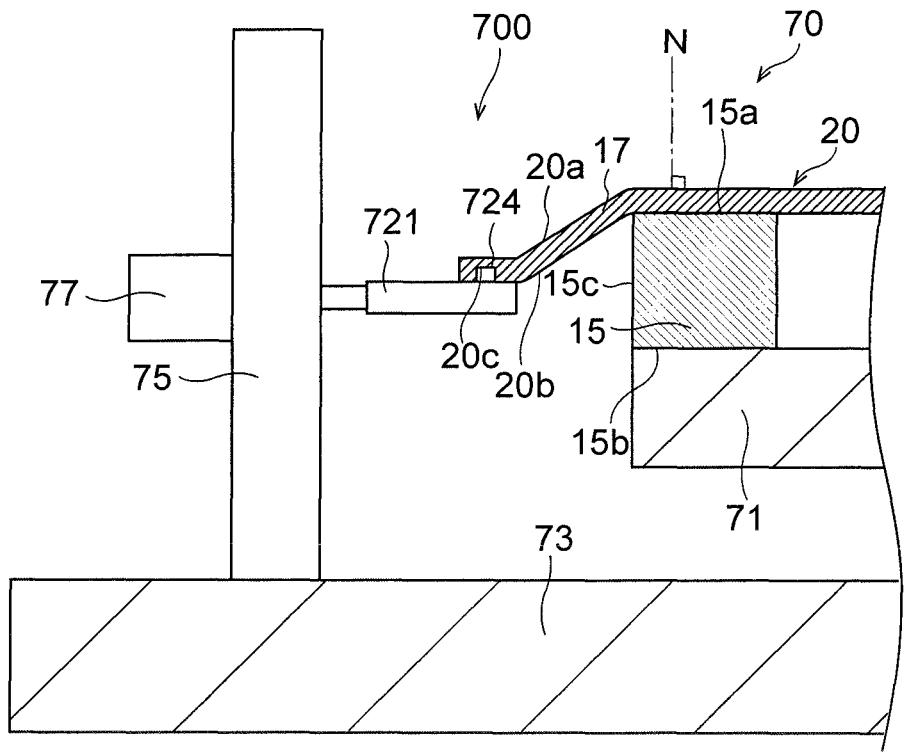
[FIG. 32]
Figure 33:
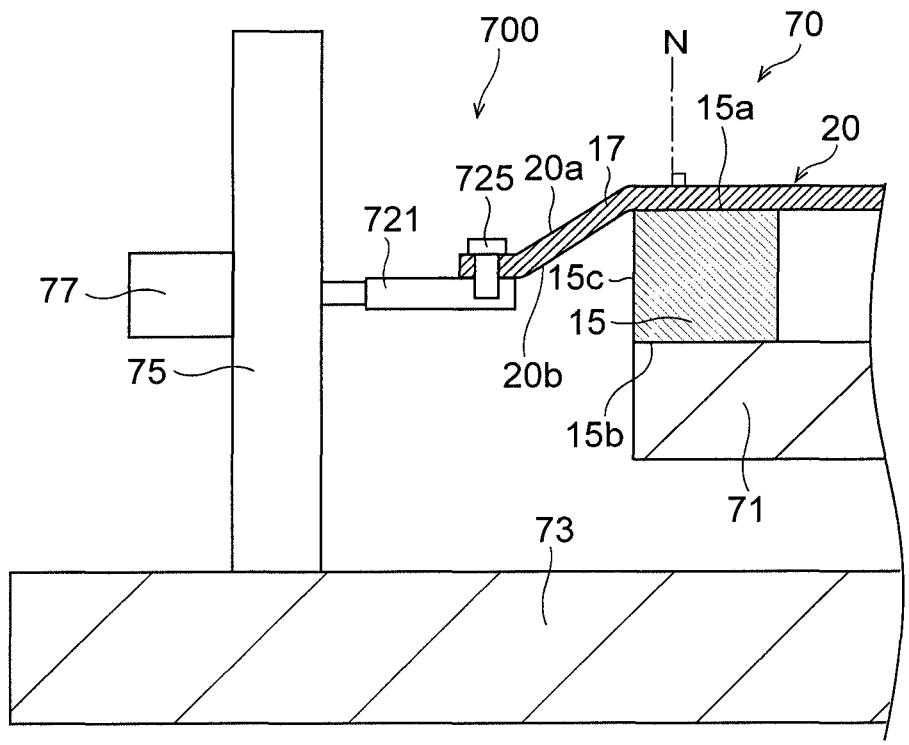
[FIG. 33]
Figure 34:
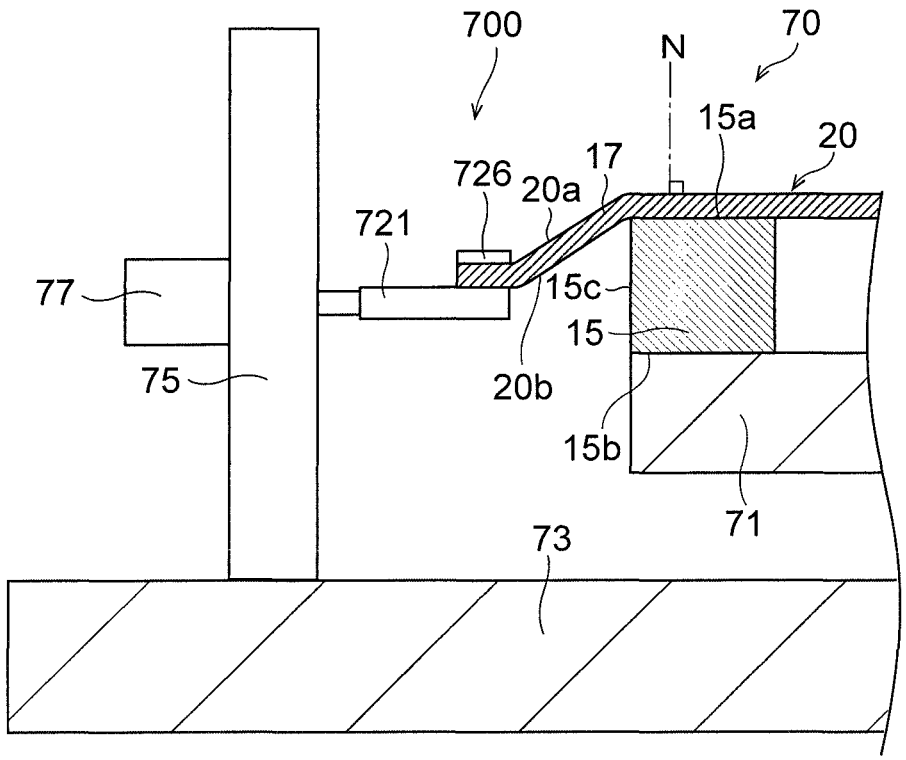
[FIG. 34]

Twelfth Modification of Manufacturing Apparatus for Vapor Deposition Mask Device In addition, as illustrated in FIG. 32, the jig 700 may include the support plates 721 and bolts 725. In this case, by bolting the vapor deposition mask 20 to the support plates 721, the vapor deposition mask 20 can be fixed to the support plates 721. In this case, also, since the jig 700 can firmly support the vapor deposition mask 20, adhesion between the vapor deposition mask 20 and the frame 15 can be further enhanced.

Thirteenth Modification of Manufacturing Apparatus for Vapor Deposition Mask Device Besides, in the present embodiment described above, the jig 700 may include the support plates 721 and magnet 726. In this case, by putting the vapor deposition mask 20 into close contact with the support plates 721 by magnetic forces, the jig 700 can support the vapor deposition mask 20. In this case, also, the jig 700 can support the vapor deposition mask 20 with a simple structure, and, at the time of detaching the vapor deposition mask 20 from the jig 700, the vapor deposition mask 20 can be easily detached.

The invention claimed is:

1. A method of manufacturing a vapor deposition mask device, the method comprising:
    a preparing step of preparing a vapor deposition mask that includes a plurality of through-holes extending from a first surface to a second surface; and
    a welding step of welding the vapor deposition mask to a front surface of a frame that includes the front surface and a back surface opposite to the front surface,
    wherein the vapor deposition mask has a pair of ear parts constituting a pair of end portions,
    wherein each of the pair of ear parts includes a weld section welded to the front surface of the frame, and an extension section located between the weld section and the end portion of the vapor deposition mask, and
    wherein the welding step includes
        a step of applying tension to the vapor deposition mask in such a manner that the second surface of the weld section is in close contact with the front surface of the frame, and the second surface of the extension section is at least partly located closer to the back surface of the frame than the front surface of the frame, and
        a step of joining the weld section of the vapor deposition mask to the frame in a state in which the tension is applied to the vapor deposition mask,
    wherein the frame includes an outside surface extending between the front surface and the back surface, and is provided with a connection surface that connects the front surface and the outside surface between the front surface and the outside surface, and
    wherein a profile of the connection surface has at least partly an arcuate shape protuberant toward the vapor deposition mask, as viewed in a section along a normal direction of the first surface, and a radius of curvature of the arcuate shape is equal to or more than 0.1 mm.

2. The method of manufacturing a vapor deposition mask device according to claim 1, wherein in the step of joining the weld section to the frame, laser light is applied from the first surface.

3. The method of manufacturing a vapor deposition mask device according to claim 1, wherein in the step of applying the tension to the vapor deposition mask, the frame is moved in a normal direction of the first surface.

4. The method of manufacturing a vapor deposition mask device according to claim 1, wherein in the step of applying the tension to the vapor deposition mask, the vapor deposition mask is supported by a jig.

5. The method of manufacturing a vapor deposition mask device according to claim 4, wherein the jig is a clamp.

6. The method of manufacturing a vapor deposition mask device according to claim 5, wherein in the step of applying the tension to the vapor deposition mask, the extension section of the vapor deposition mask is clamped by the clamp.

7. The method of manufacturing a vapor deposition mask device according to claim 6, wherein the clamp includes a first clamp that clamps the extension section of one of the pair of ear parts, and a second clamp that clamps the extension section of the other of the pair of ear parts.

8. The method of manufacturing a vapor deposition mask device according to claim 7, wherein in the step of applying the tension to the vapor deposition mask, at least one of the first clamp and the second clamp is moved in a normal direction of the first surface.

9. The method of manufacturing a vapor deposition mask device according to claim 7, wherein in the step of applying the tension to the vapor deposition mask, at least one of the first clamp and the second clamp is moved along a plane direction of the first surface.

10. An apparatus for manufacturing a vapor deposition mask device that includes a vapor deposition mask including a plurality of through-holes extending from a first surface to a second surface and a frame including a front surface facing the second surface of the vapor deposition mask and a back surface opposite to the front surface, the apparatus comprising:
    a jig that supports the vapor deposition mask; and
    a stage that is in close contact with the frame,
    wherein the vapor deposition mask has a pair of ear parts constituting a pair of end portions, wherein each of the pair of ear parts includes a weld section welded to the front surface of the frame, and an extension section located between the weld section and the end portion of the vapor deposition mask, wherein the jig supports the extension section of the vapor deposition mask, and wherein, in a state in which the jig supports the vapor deposition mask, the second surface of the weld section makes contact with the front surface of the frame, and the second surface of the extension section is at least partly located closer to the back surface of the frame than the front surface of the frame, wherein the frame includes an outside surface extending between the front surface and the back surface, and is provided with a connection surface that connects the front surface and the outside surface between the front surface and the outside surface, and wherein a profile of the connection surface has at least partly an arcuate shape protuberant toward the vapor deposition mask, as viewed in a section along a normal direction of the first surface, and a radius of curvature of the arcuate shape is equal to or more than 0.1 mm.

11. The apparatus for manufacturing a vapor deposition mask device according to claim 10, wherein the stage is movable in a normal direction of the first surface.

12. The apparatus for manufacturing a vapor deposition mask device according to claim 10, wherein the jig is a clamp that clamps the extension section of the vapor deposition mask.

13. The apparatus for manufacturing a vapor deposition mask device according to claim 12, wherein the clamp has a first clamp that clamps the extension section of one of the pair of ear parts of the vapor deposition mask, and a second clamp that clamps the extension section of the other of the pair of ear parts.

14. The apparatus for manufacturing a vapor deposition mask device according to claim 13, wherein at least one of the first clamp and the second clamp is movable in a normal direction of the first surface.

15. The apparatus for manufacturing a vapor deposition mask device according to claim 13, wherein at least one of the first clamp and the second clamp is movable in a plane direction of the first surface.

16. The apparatus for manufacturing a vapor deposition mask device according to claim 10, the apparatus further comprising:

a welding device to join the vapor deposition mask and the frame to each other.

17. A method of manufacturing a vapor deposition mask device, the vapor deposition mask device including
a vapor deposition mask that has a first surface, a second surface opposite to the first surface, and a plurality of through-holes extending from the first surface to the second surface, and
a frame having a third surface and a fourth surface opposite to the third surface, the method of manufacturing the vapor deposition mask device comprising:

a step of applying tension to the vapor deposition mask, in a state in which at least part of the second surface makes contact with the third surface, and at least part of the second surface of a part of the vapor deposition mask, which does not overlap with the frame as viewed from a normal direction of the first surface, is located closer to the fourth surface than the third surface; and a step of welding the vapor deposition mask to the frame, wherein the frame includes a fifth surface extending between the third surface and the fourth surface, and is provided with a sixth surface that connects the third surface and the fifth surface between the third surface and the fifth surface, and wherein a profile of the sixth surface has at least partly an arcuate shape protuberant toward the vapor deposition mask, as viewed in a section along the normal direction of the first surface, and a radius of curvature of the arcuate shape is equal to or more than 0.1 mm.

18. The method of manufacturing a vapor deposition mask device according to claim 17, wherein in the step of welding the vapor deposition mask to the frame, laser light is applied from the first surface.

19. The method of manufacturing a vapor deposition mask device according to claim 17, wherein in the step of applying the tension to the vapor deposition mask, the frame is moved in the normal direction of the first surface.

20. The method of manufacturing a vapor deposition mask device according to claim 17, wherein in the step of applying the tension to the vapor deposition mask, the vapor deposition mask is supported by a jig.

21. The method of manufacturing a vapor deposition mask device according to claim 20, wherein the jig is a clamp.

22. The method of manufacturing a vapor deposition mask device according to claim 21, wherein the clamp has a first clamp, and a second clamp located on an opposite side from the first clamp with respect to the vapor deposition mask.

23. The method of manufacturing a vapor deposition mask device according to claim 22, wherein in the step of applying the tension to the vapor deposition mask, at least one of the first clamp and the second clamp is moved in the normal direction of the first surface.

24. The method of manufacturing a vapor deposition mask device according to claim 22, wherein in the step of applying the tension to the vapor deposition mask, at least one of the first clamp and the second clamp is moved along a plane direction of the first surface of the vapor deposition mask.

25. An apparatus for manufacturing a vapor deposition mask device, the vapor deposition mask device including
a vapor deposition mask that has a first surface, a second surface opposite to the first surface, and a plurality of through-holes extending from the first surface to the second surface, and
a frame having a third surface and a fourth surface opposite to the third surface, the apparatus for manufacturing the vapor deposition mask device comprising:

a jig that supports the vapor deposition mask; and
a stage that is in close contact with the frame, wherein at least part of the second surface of the vapor deposition mask makes contact with the third surface, and, at least part of the second surface of a part of the vapor deposition mask, which does not overlap with the frame as viewed from a normal direction of the first surface, is located closer to the fourth surface than the third surface, wherein the frame includes a fifth surface extending between the third surface and the fourth surface, and is provided with a sixth surface that connects the third surface and the fourth surface between the third surface and the fourth surface, and wherein a profile of the sixth surface has at least partly an arcuate shape protuberant toward the vapor deposition mask, as viewed in a section along the normal direction of the first surface, and a radius of curvature of the arcuate shape is equal to or more than 0.1 mm.

26. The apparatus for manufacturing a vapor deposition mask device according to claim 25, wherein the stage is movable in the normal direction of the first surface.

27. The apparatus for manufacturing a vapor deposition mask device according to claim 25, wherein the jig is a clamp.

28. The apparatus for manufacturing a vapor deposition mask device according to claim 27, wherein the clamp has a first clamp, and a second clamp that is located on an opposite side from the first clamp with respect to the vapor deposition mask.

29. The apparatus for manufacturing a vapor deposition mask device according to claim 28, wherein at least one of the first clamp and the second clamp is movable in the normal direction of the first surface.

30. The apparatus for manufacturing a vapor deposition mask device according to claim 28, wherein at least one of the first clamp and the second clamp is movable along a plane direction of the first surface.

31. The apparatus for manufacturing a vapor deposition mask device according to claim 25, the apparatus further comprising:

a welding device to join the vapor deposition mask and the frame to each other.

* * * * *